(12) United States Patent
Fujisaki et al.

(10) Patent No.: US 7,864,568 B2
(45) Date of Patent: Jan. 4, 2011

(54) SEMICONDUCTOR STORAGE DEVICE

(75) Inventors: Yoshihisa Fujisaki, Hachioji (JP); Satoru Hanzawa, Hachioji (JP); Kenzo Kurotsuchi, Kodaira (JP); Nozomu Matsuzaki, Kodaira (JP); Norikatsu Takaura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 28 days.

(21) Appl. No.: 12/516,690

(22) PCT Filed: Dec. 7, 2006

(86) PCT No.: PCT/JP2006/324424

§ 371 (c)(1),
(2), (4) Date: May 28, 2009

(87) PCT Pub. No.: WO2008/068867

PCT Pub. Date: Jun. 12, 2008

(65) Prior Publication Data

US 2010/0061132 A1    Mar. 11, 2010

(51) Int. Cl.
*G11C 11/00* (2006.01)
(52) U.S. Cl. .......................................... 365/163; 365/51
(58) Field of Classification Search .................. 365/163, 365/51

See application file for complete search history.

(56) References Cited

U.S. PATENT DOCUMENTS 6,795,329 B2    9/2004    Jacob
7,002,837 B2    2/2006    Morimoto (Continued)

FOREIGN PATENT DOCUMENTS

JP    2004-272975 A    9/2004

(Continued)

OTHER PUBLICATIONS

Ha et al., "An Edge Contact Type Cell for Phase Change RAM Featuring Very Low Power Consumption", Symposium on VLSI Technology Digest of Technical Papers, 2003, pp. 175-176.

(Continued)

*Primary Examiner*—Huan Hoang
(74) *Attorney, Agent, or Firm*—Miles & Stockbridge P.C.

(57) ABSTRACT

In a semiconductor storage device such as a phase change memory, a technique which can realize high integration is provided. The semiconductor storage device includes a phase change thin film 101 having two stable phases of a crystal state with low electric resistance and an amorphous state with high electric resistance, upper plug electrodes 102 and 103 provided on one side of the phase change thin film 101, a lower electrode 104 provided on the other side of the phase change thin film 101, a selecting transistor 114 whose drain/source terminals are connected to the upper plug electrode 102 and the lower electrode 104, and a selecting transistor 115 whose drain/source terminals are connected to the upper plug electrode 103 and the lower electrode 104, and a first memory cell is configured with the selecting transistor 114 and a phase change region 111 in the phase change thin film 101 sandwiched between the upper plug electrode 102 and the lower electrode 104, and a second memory cell is configured with the selecting transistor 115 and a phase change region 112 in the phase change thin film 101 sandwiched between the upper plug electrode 103 and the lower electrode 104.

13 Claims, 28 Drawing Sheets

U.S. PATENT DOCUMENTS

| | | |
|---|---|---|
| 7,414,879 B2 | 8/2008 | Asao et al. |
| 7,450,411 B2 * | 11/2008 | Lung et al. .................. 365/163 |
| 2006/0113614 A1 | 6/2006 | Yoo et al. |

FOREIGN PATENT DOCUMENTS

| | | |
|---|---|---|
| JP | 2005-530355 A | 10/2005 |
| JP | 2006-135338 A | 5/2006 |
| JP | 2007-115956 A | 5/2007 |

OTHER PUBLICATIONS

Horii et al., "A Novel Cell Technology Using N-doped GeSbTe Films for Phase Change RAM", Symposium on VLSI Technology Digest of Technical Papers, 2003, pp. 177-178.

* cited by examiner

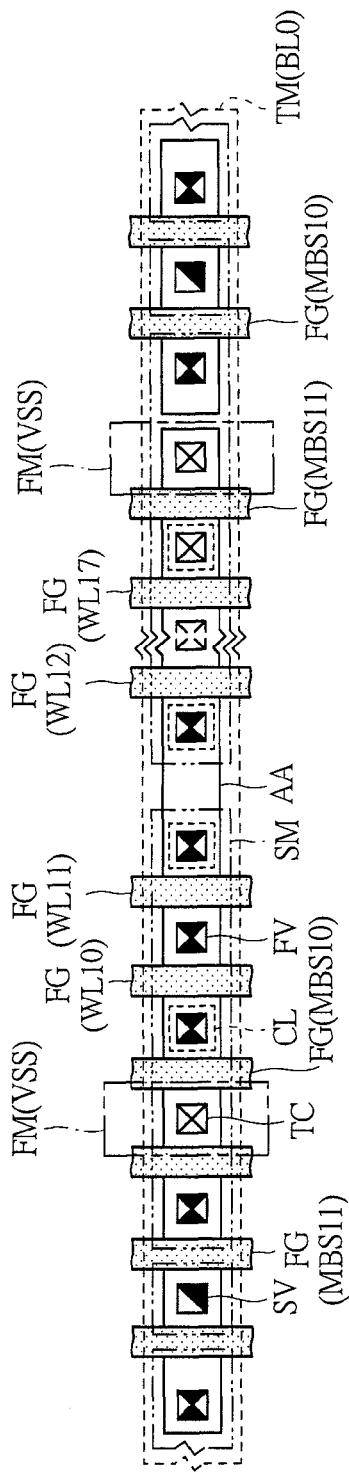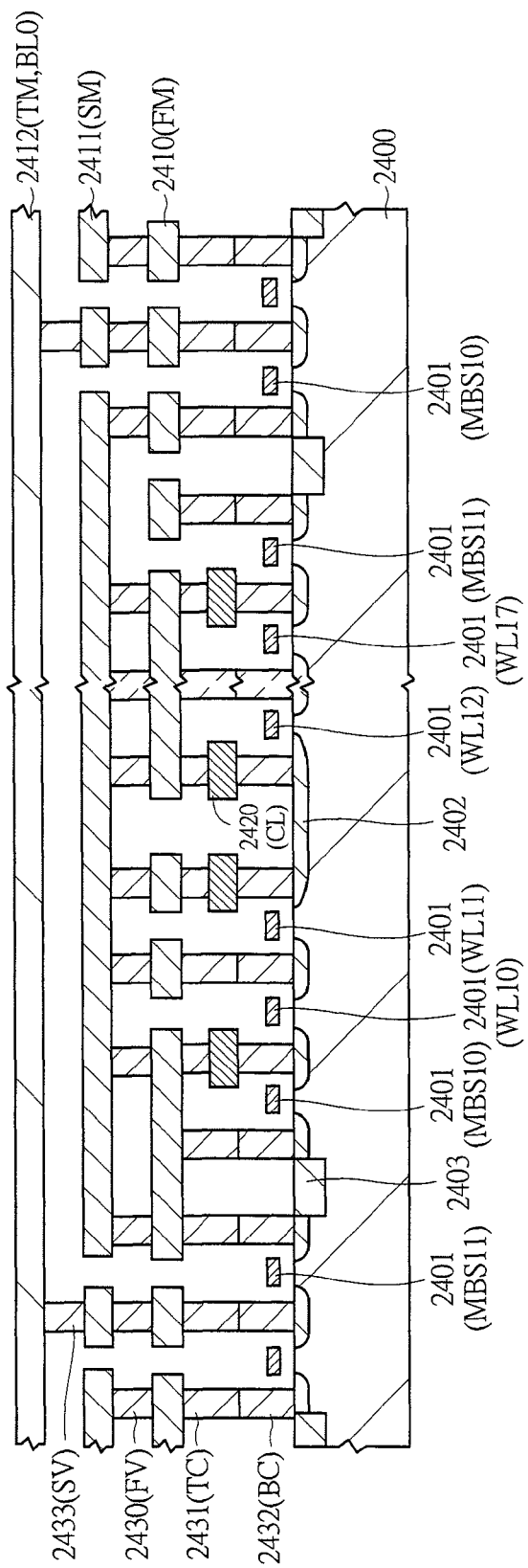
FIG. 24A
FIG. 24B

SEMICONDUCTOR STORAGE DEVICE

TECHNICAL FIELD

The present invention relates to a semiconductor storage device, and more particularly, the present invention relates to a technique effectively applied to a semiconductor integrated circuit device having: a high density integrated memory circuit including a memory cell using a phase change material particularly represented by a chalcogenide material; a logic mixedly mounted memory in which a memory circuit and a logic circuit are provided on the same semiconductor substrate; or an analog circuit. Particularly, the present invention relates to a structure in which memory cells are arranged in high density so that a high-speed drive can be achieved.

BACKGROUND ART

A semiconductor nonvolatile memory is frequently used for mobile equipment such as a mobile phone, and in recent years, a market thereof has been increasingly spread. Currently, the semiconductor nonvolatile memory which is most utilized is a FLASH memory. However, since a rewriting speed thereof is essentially slow, it is mainly used as a programmable ROM, an information storage device for a still camera, in which the rewriting is not frequently performed, or the like. Also, since the FLASH memory requires large power consumption at the rewriting time, it includes a large issue from the viewpoint of reduction of battery exhaustion which is important for mobile terminal equipment.

On the other hand, since a high-speed RAM is required as a working memory, both memories of the FLASH memory and a DRAM are mixedly mounted in the mobile terminal equipment. If a device provided with characteristics of these two memories can be realized, an impact of the device is extremely large in that it becomes possible not only to integrate the FLASH memory and the DRAM on one chip but also to replace all semiconductor memories with the device.

As one of candidates for realizing the device which has low power consumption and high rewriting speed and is suitable also for the working memory of the mobile terminal equipment, there is a nonvolatile memory using a phase change film.

As already known, materials capable of switching reversibly from one phase to the other phase are used for the phase change memory. A reading is possible by a difference between electric characteristics of these phase states. For example, these materials can change between a disordered phase of an amorphous state and an ordered phase of a crystal state. The amorphous state has an electric resistance higher than that of the crystal state, so that information can be stored by using the difference between the electric resistances.

The material suitable for the phase change memory cell is an alloy containing at least one element of sulfur, selenium, and tellurium, such an alloy being called "chalcogenide". Currently, a most coming chalcogenide is an alloy made of germanium, antimony, and tellurium ($Ge_2Sb_2Te_5$), and the alloy has been already widely used for information storage media of a rewritable optical disk.

In the phase change memory, information storage is performed by using a difference between phase states of the chalcogenide. A phase change from the crystal state to the amorphous state or a reverse phase change from the amorphous state to the crystal state can be obtained by locally raising temperature of the chalcogenide. Although depending on the phase change material, its composition, and the like, both phases are generally stabilized at approximately 130° C. or lower so that information is stably retained. Also, when the chalcogenide is held at a crystallization temperature of 200° C. or higher for a sufficient period, the phase thereof changes to the crystal state. A crystallization time changes depending on the composition of the chalcogenide and the holding temperature. In a case of $Ge_2Sb_2Te_5$, the crystallization time thereof is, for example, 150 nanoseconds. For returning the chalcogenide to the amorphous state, the temperature is raised to a melting point thereof (approximately 600° C.) or higher and rapidly lowered to cool.

As a method of raising the temperature, a current is carried to the chalcogenide to heat by Joule heat generated from an inside of the chalcogenide or an electrode adjacent thereto. Hereinafter, the crystallization of the chalcogenide of the phase change memory cell is called a "set operation", and the amorphization thereof is called a "reset operation". Also, a state in which a phase change portion has been crystallized is called a "set state", and a state in which the phase change portion has been amorphized is called a "reset state". A set time is, for example, 150 nanoseconds, and a reset time is, for example, 50 nanoseconds.

A reading method is as follows. A voltage is applied to the chalcogenide to measure a current passing through the chalcogenide, whereby a resistance value of the chalcogenide is read, and information is identified. When the chalcogenide is in the set state at this time, even if the temperature is raised up to the crystallization temperature, the set state is maintained because the chalcogenide is already crystallized. However, when the chalcogenide is in the reset state, the information is destroyed. Therefore, for causing no the crystallization, a reading voltage must be set to a feeble voltage of, for example, approximately 0.3 V. The phase change memory is characterized in that: the resistance value in the phase change portion also changes from two digits to three digits according to the crystal state or amorphous state; and since a magnitude of the resistance value is read so as to correspond to binary information of "0" and "1", as the difference between the resistance values is larger, the sense operation is performed easier, and the read is performed at high speed. Hereinafter, the reading operation is called "read operation".

As shown in FIG. 2, while a conventionally-known phase change memory cell 200 is mostly configured with a storage device 207 and a selecting transistor 208, a configuration of a cross-point type memory cell including no selecting transistor is also considered. The storage device 207 generally includes a chalcogenide 201, an upper electrode 203, and a plug electrode 202, the electrodes sandwiching the chalcogenide 201 therebetween. Normally, although the plug electrode 202 mostly takes a plug structure having a smaller contact area with the chalcogenide than that of the upper electrode 203, a thin film may be used as the electrode as described in Non-Patent Document 1. Note that "204" indicates a word line (WL), "205" indicates a source line, and "206" indicates a bit line (BL).

A general operation of the phase change memory is described in Non-Patent Document 2. The reset operation is performed by starting up the word line and applying a current pulse having a pulse width of 20 to 50 nanoseconds to the bit line. The set operation is performed by starting up the word line and applying a current pulse having a pulse width of 60 to 200 nanoseconds to the bit line. The read operation is performed by starting up the word line and applying a current pulse having a pulse width of 20 to 100 nanoseconds to the bit line. The current pulses used for the reset operation, the set operation, and the read operation flow from the bit line toward the source line in all of the operations or from the source line toward the bit line in all of the operations.

Compared to the set operation required for raising the temperature only up to the crystallization temperature, a larger current is required for the reset operation required for heating up to the melting point which is higher than the crystallization temperature. By reducing the current for the reset operation, an area size of a selected device is reduced so that high memory integration is made possible.

Patent Document 1: Japanese Patent Application Laid-Open Publication No. 2004-272975

Non-Patent Document 1: Y. H Ha and other 6 people, "An Edge Contact Type Cell for Phase Change RAM Featuring Very Low Power Consumption", 2003 Symposium on VLSI Technology Digest Technical Papers, USA, 2003, p. 175-176

Non-Patent Document 2: H. Horii and other 7 people, "A Novel Cell Technology Using N-doped GeSbTe Films for Phase Change RAM", 2003 Symposium on VLSI Technology Digest Technical Papers, USA, 2003, p. 177-178

DISCLOSURE OF THE INVENTION

Problems to be Solved by the Invention

As described in the "BACKGROUND ART", while the phase change memory is rewritable with high speed and low power consumption compared to the FLASH memory which is a currently-common semiconductor nonvolatile memory, considering high integration is inferior compared to the FLASH memory. For example, when a memory array is configured with a conventional-type phase change memory cell shown in FIG. 2, if it is assumed that a minimum feature size is "F", an area size per cell is $8F^2$ also in an ideal designed case. Compared to this, the area size per cell is $4F^2$ in a most-advanced NAND-type FLASH memory, and an occupied area size per bit is further reduced down to $2F^2$ by using a multi level cell technology.

Mainly, high integration has been rapidly advanced in the semiconductor nonvolatile memory utilized for the mobile information terminal equipment and the like, and further, needs of low power consumption of the semiconductor nonvolatile memory are also high. It is predicted that there is a limitation of achieving the FLASH memory with low power consumption, and therefore, it is necessary to develop a high integration technique of the phase change memory which is currently disadvantageous to high integration in order to realize the semiconductor nonvolatile memory with low power consumption and high integration.

Accordingly, an object of the present invention is to provide a technique which can realize high integration in a semiconductor storage device such as a phase change memory.

The above and other objects and novel characteristics of the present invention will be apparent from the description of the specification and the accompanying drawings.

Means for Solving the Problems

Outlines of typical ones of the inventions disclosed in the present application will be briefly described as follows.

That is, a semiconductor storage device according to the present invention is characterized by including: a phase change thin film having two stable phases of a crystal state with a low electric resistance and an amorphous state with a high electric resistance; first and second electrodes provided on one side of the phase change thin film; a third electrode provided on the other side of the phase change thin film; a first transistor whose drain terminal is connected to the first electrode, whose source terminal is connected to the third electrode, and whose gate terminal is connected to a first word line; and a second transistor whose drain terminal is connected to the second electrode, whose source terminal is connected to the third electrode, and whose gate terminal is connected to a second word line, wherein a first memory cell is provided with the first transistor and a first phase change region in the phase change thin film sandwiched between the first electrode and the third electrode, a second memory cell is provided with the second transistor and a second phase change region in the phase change thin film sandwiched between the second electrode and the third electrode, the first transistor is turned off to carry a current from the first electrode to the third electrode in writing to the first memory cell, and the second transistor is turned off to carry a current from the second electrode to the third electrode in writing to the second memory cell.

Also, the semiconductor storage device according to the present invention is characterized by including: a plurality of word lines; a plurality of bit lines intersecting the plurality of word lines; a plurality of memory cells arranged at the intersection of the plurality of word lines and the plurality of bit lines, and each of memory cells including a transistor and a storage device whose resistance changes according to storage information; a plurality of hierarchy switches arranged in a space between one of the plurality of word lines and another one at constant interval; a common data line; a switch circuit arranged in a space between the plurality of bit lines and the common data line and for selecting one of the plurality of bit lines to connect the one to the common data line; and a rewriting circuit connected to the common data line, wherein a first hierarchy switch of the plurality of hierarchy switches is inserted between a first bit line of the plurality of bit lines and a first memory cell of the plurality of memory cells and between a ground voltage terminal and the first memory cell, and a second hierarchy switch of the plurality of the hierarchy switches is inserted between the first bit line and a second memory cell of the plurality of memory cells and between the ground voltage terminal and the second memory cell.

Further, the semiconductor storage device according to the present invention is characterized by having: first and second phase change thin films each having two stable phases of a crystal state with a low electric resistance and an amorphous state with a high electric resistance; a first electrode provided on one side of the first phase change thin film; a second electrode provided on the other side of the first phase change thin film; a first transistor whose drain terminal is connected to the first electrode, whose source terminal is connected to the second electrode, and whose gate terminal is connected to a first word line; a third electrode provided on one side of the second phase change thin film; a fourth electrode provided on the other side of the second phase change thin film; and a second transistor whose drain terminal is connected to the third electrode, whose source terminal is connected to the fourth electrode, and whose gate terminal is connected to a second word line, and wherein, a first memory cell is provided with the first transistor and a first phase change region in the phase change thin film sandwiched between the first electrode and the second electrode, a second memory cell is provided with the second transistor and a second phase change region in the phase change thin film sandwiched between the third electrode and the fourth electrode, the first transistor is turned off and the second transistor is turned on to carry a current from the first electrode to the fourth electrode in an information writing operation to the first memory cell, and the first transistor is turned on and the second transistor is turned off to carry a current from the first electrode to the fourth electrode in an information writing operation to the second memory cell.

EFFECTS OF THE INVENTION

Effects of typical ones of the inventions disclosed in the present application will be briefly described as follows.

(1) A high-speed readable and high-capacity non-volatile semiconductor storage device can be realized by using a semiconductor integrated circuit device utilizing a technique of the present invention.

(2) Also, a high-reliability and high-performance microprocessor for embedded applications can be provided by mixedly mounting the device on the same substrate that a semiconductor logic computing device is provided on.

(3) Further, the device can be provided as a single chip.

BRIEF DESCRIPTIONS OF THE DRAWINGS

FIGS. 24A and 24B are another diagrams each showing the configuration example of the phase change memory array in the semiconductor information storage device according to the fourth embodiment of the present invention;

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1A:
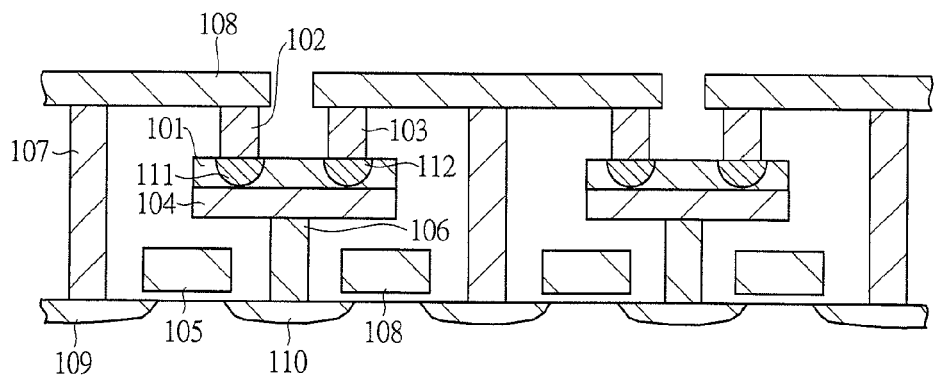
FIGS. 1A to 1E are diagrams showing structures, a circuit frame diagram, and operation methods of a storage device in a semiconductor storage device according to a first embodiment of the present invention.
Figure 1B:
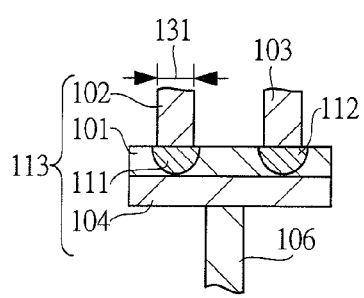
Figure 1C:
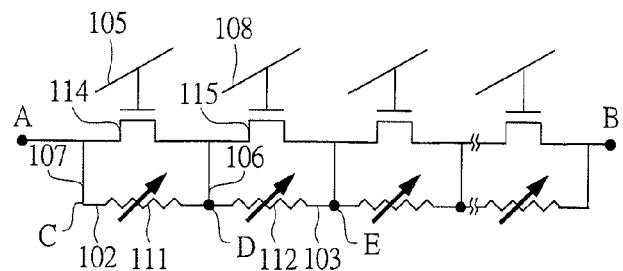

Each of FIGS. 1A, 1B, and 1C shows a structure of a storage device array used in a semiconductor storage device of the present invention. A phase change thin film (chalcogenide) 101 is sandwiched between an upper plug electrode 102 and a lower electrode 104. A composition of the phase change thin film 101 is $Ge_2Sb_2Te_5$, and compositions of the upper plug electrode 102 and the lower electrode 104 are tungsten. A plug size 131 is a diameter of 160 nm. The plug size varies according to a generation of a semiconductor process to be used. Although tungsten is frequently used as the composition of the upper plug electrode 102, any material can be used as long as having conductivity.

Figure 1D:
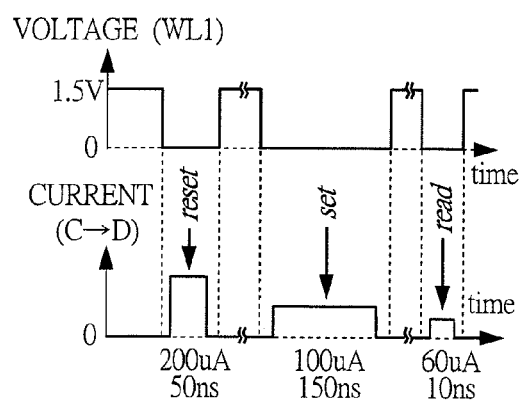
Figure 1E:
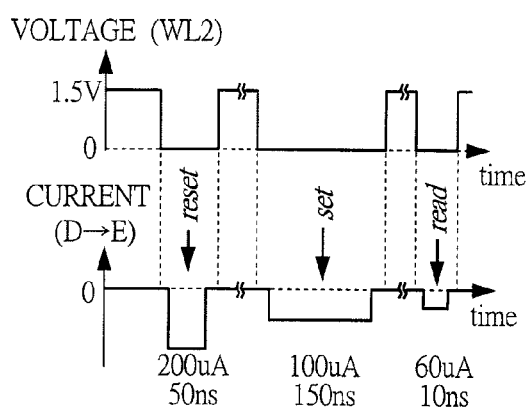

Each of FIGS. 1D and 1E shows a procedure when a writing and a reading is performed to a memory cell configuring the circuit shown in FIG. 1C. First, all word line voltages are set to 1.5 V to set all selecting transistors to be ON state. Next, a pulse of 0 V is applied to a word line 105 (WL1) of a selecting transistor 114 of a cell to which the writing/reading is performed according to a writing and reading time to set the selecting transistor 114 to be OFF state. Thereafter, a current pulse according to the reset operation, the set operation, and the read operation is applied to terminals A and B to perform the writing and reading. Since the selecting transistor 114 becomes OFF state during 0 V is applied thereto, almost all of the voltage applied to the terminals A and B is applied to both ends of a phase change region (phase change storage unit) 111 of a selected cell. In this manner, the writing and reading can be performed to a desired memory cell.

As already described with reference to FIG. 1E, a writing operation to a phase change region (phase change storage unit) 112 adjacent to the phase change region 111 can be performed by applying a voltage between the terminals A and B, the voltage having opposite polarity to that of the writing to the phase change region 111 as shown in FIG. 1C.

As described above, it is found that the phase change region 111 and the selecting transistor 114 or the phase change region (phase change storage unit) 112 and a selecting transistor 115 configure one memory cell.

When such a large current of 200 μA or larger is flown in the phase change storage unit for a short time of approximately 50 ns, a transition from a crystallization state to an amorphous state can be performed to be rewritten. This operation is called "reset operation", and a current condition thereof changes depending on a composition of the phase change material, a structure and a size of the device, and the like. Similarly, it is necessary to optimize a current condition required for the set operation for each device to be manufactured. Although it is desirable that the selecting transistor configuring the memory cell is ideally a switch whose ON resistance is zero and whose OFF resistance is infinite, both of ON/OFF state actually have finite resistance values. Therefore, when an optimal current pulse as shown in FIG. 1D is applied to the phase change region 111, current is flown also in all of transistors and all of phase change storage units configuring the circuit shown in FIG. 1C. Here, an ON resistance of the transistor is represented by "$R_{ON}$", an OFF resistance thereof is represented by "$R_{OFF}$", a set resistance of the phase change storage unit is represented by "$R_{set}$", a reset resistance thereof is represented by "$R_{reset}$", the number of memory cells configuring the circuit shown in FIG. 1C and connected in series is represented by "N", and a value of current flowing between the terminals A and B is represented by "$I_{AB}$". When the phase change storage unit of the selected memory cell is in the set state and a reset current "$I_{reset}$" is flown in the phase change storage unit, a current value "$I_1$" flowing in a phase change storage unit belonging to a same array and in which an unselected cell is in the set state is expressed as follows.

$$I_1 = I_{reset} \times (R_{ON}/R_{OFF}) \times ((R_{OFF}+R_{set})/(R_{ON}+R_{set})) \quad (1)$$

The $I_1$ indicates a value of a largest current flowing in the phase change storage unit of the unselected cell being in a low resistance state. Similarly, a value "$I_2$" of a largest current flowing in the phase change storage unit of the unselected cell being in a high resistance state (reset state) is expressed by the following equation.

$$I_2 = I_{reset} \times (R_{ON}/R_{OFF}) \times ((R_{OFF}+R_{set})/(R_{ON}+R_{reset})) \quad (2)$$

When both $I_1$ and $I_2$ become a negligible large value compared to the current $I_{set}$ used for the set operation, information disturbance of the unselected cell occurs such that resistance reduction of the high resistance state (transition from the reset state to the set state) due to repetitive current pulse application or fixation of the low resistance state due to the writing to the low resistance state (set state). Accordingly, the selecting transistor must be designed so as to satisfy at least the following equations.

$$I_1 < I_{set} \quad (3)$$

$$I_2 < I_{set} \quad (4)$$

Ideally, $$I_1 < 10 \times I_{set} \quad (5)$$

$$I_2 < 10 \times I_{set} \quad (6)$$

The following relationship is built between a voltage $V_{AB}$ which is applied between the terminals A and B and a value $I_{read}$ of current flowing in the phase change storage unit of the selected cell being in the high resistance state (reset state) in the read operation.

$$V_{AB}/I_{read} = R_{reset} + (N-1) \times (R_{ON}^2/R_{OFF}) \times ((R_{OFF}+R_{set})/(R_{ON}+R_{set})) \quad (7)$$

The second term of the right side of Equation (7) is a parasitic resistance due to the unselected cell. The transistor must be designed so as to satisfy such that the parasitic resistance is sufficiently smaller than the reset resistance, that is, $$(N-1) \times (R_{ON}^2/R_{OFF}) \times ((R_{OFF}+R_{set})/(R_{ON}+R_{set})) \ll R_{reset} \quad (8)$$

and ideally, $$(N-1) \times (R_{ON}^2/R_{OFF}) \times ((R_{OFF}+R_{set})/(R_{ON}+R_{set})) < 10 \times R_{reset} \quad (9)$$

and otherwise it becomes difficult to read information stored in the phase change storage unit. That is, a performance of the cell-selecting transistor must be determined according to a characteristic of the phase change storage unit so as to satisfy Equation (9). However, in the above discussion using Equations (1) to (9), all current values are handled as positive values for simplification. Here, since only magnitude of the resistance value of the phase change storage unit and the MOS transistor configuring the memory cell array are handled, positive and negative of the current value does not affect a result of the discussion at all.

Next, a plane structure of a main portion of the memory cell will be described.

Figure 3A:
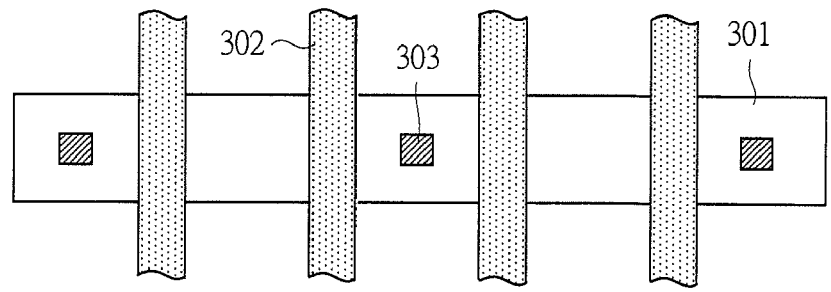
FIGS. 3A to 3D are diagrams each showing a plane structure of a main portion of the storage device in the first embodiment of the present invention.

FIGS. 3A to 3D show plane layouts of the phase change memory array having a cross sectional structure shown in FIG. 1A as following a manufacturing process of the device. First, FIG. 3A shows an active region (device active region) 301, a word line 302 of the MOS transistor, and a plug 303 connected to a diffusion layer to be a source region and a drain region of the MOS transistor. This state corresponds to a state in which processes up to manufacturing a plug 106 is completed in the cross sectional view of FIG. 1A.

Figure 3B:
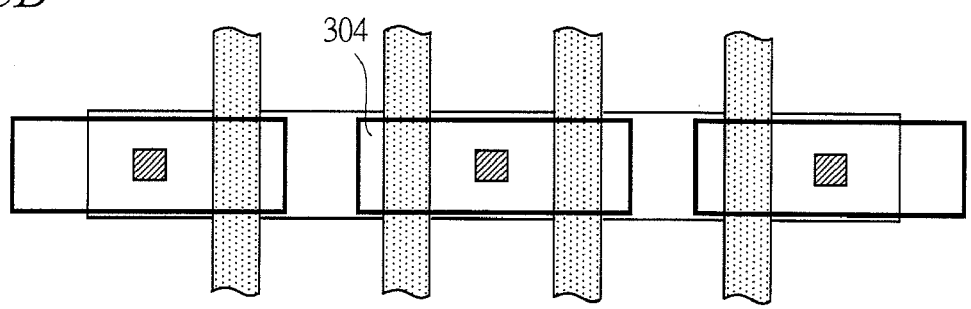

FIG. 3B shows a region 304 obtained by processing a stacked film of a lower electrode and a phase change film formed on the plug 303. This state corresponds to a state in which the process of the stacked film is completed by forming the lower electrode 104 and the phase change thin film 101 on the plug 106 in FIG. 1A.

Figure 3C:
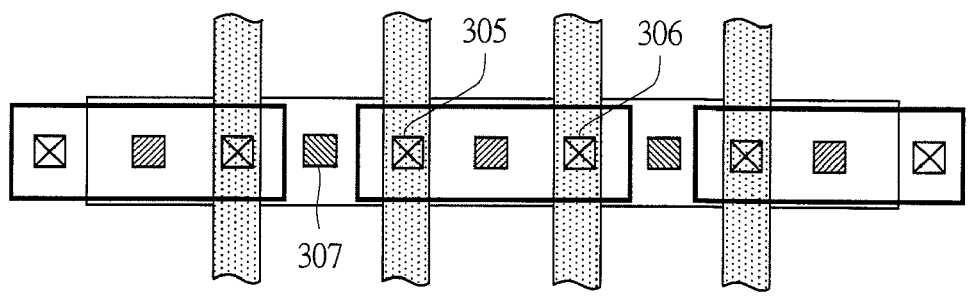

FIG. 3C shows a plug 305 or a plug 306 formed on the phase change film whose process is completed in FIG. 3B, and further, a plug 307 connected to the diffusion layer of the MOS transistor. The plugs 305 and 306 are connected to the same phase change region in which the process is completed in FIG. 3B. A structure shown in FIG. 3C corresponds to a state in which all structures except for a word line (wiring layer) 108 is completed in FIG. 1A.

Figure 3D:
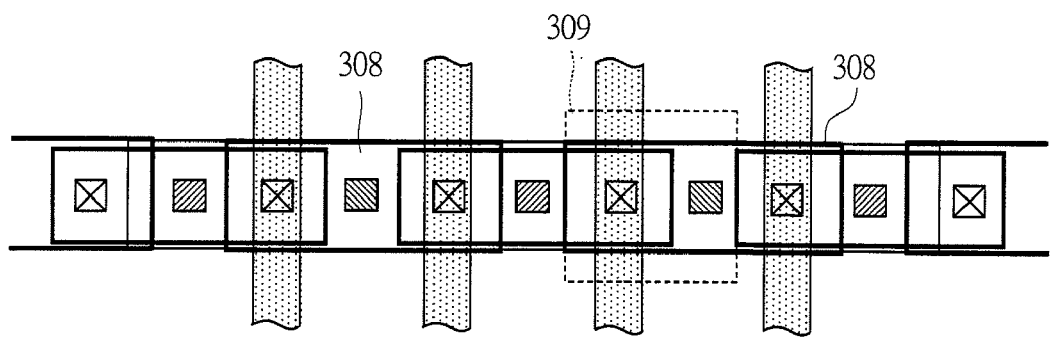

FIG. 3D shows a completed state of the main portion of the memory cell in which the wiring layer to be connected to the plugs 305, 306, and 307 is formed so that the process is finally completed. That is, "308" indicates a wiring portion connecting between the plug 307 connected to the diffusion layer and the plugs 305 and 306 connected to the phase change film, and the wiring portion corresponds to 108 in FIG. 1A.

According to the above manner, the main portion of the phase change memory cell array having the cross sectional structure shown in FIG. 1A and having the equivalent circuit shown in FIG. 1C is completed. Although one memory cell region 309 is shown in FIG. 3D, it is found that a cell area size of approximately half of the conventional-type phase change memory cell can be realized even in a configuration having one transistor+one phase change device by adopting a NAND-type structure.

Next, a manufacturing method of the memory cell will be described.

Figure 4:
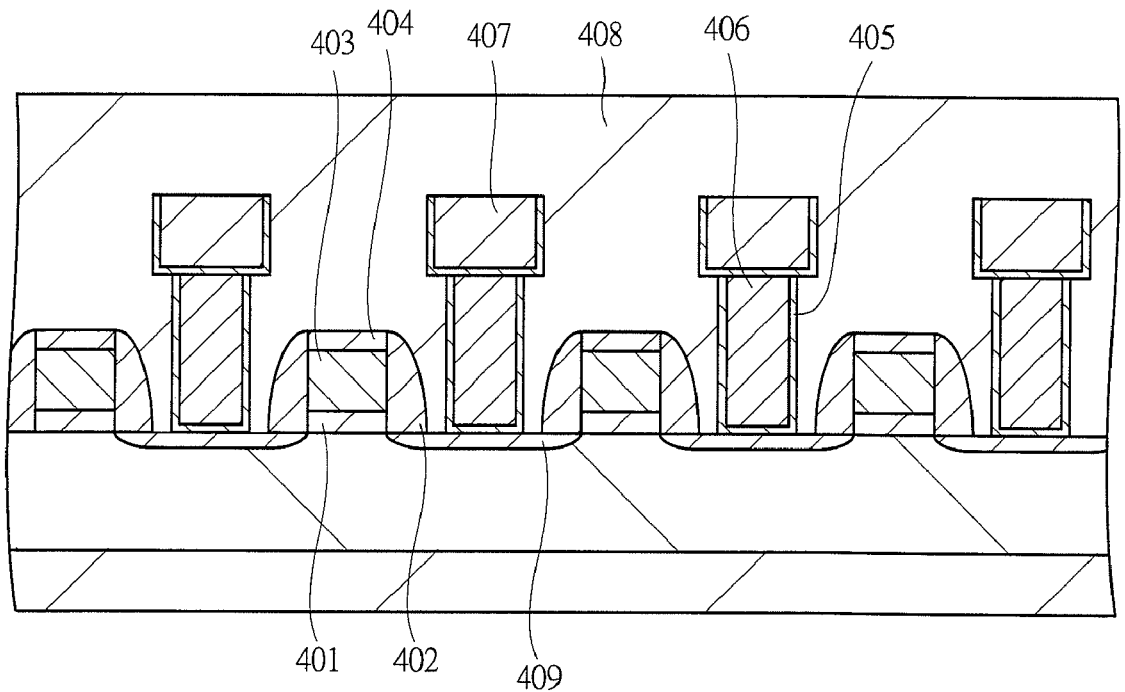
FIG. 4 is a sectional view of a principal part of the storage device according to the first embodiment of the present invention.

First, a structure shown in the cross sectional view of the principal part in FIG. 4 is manufactured by using normal semiconductor processes. A gate electrode 403 contacts with a gate dielectric film 401, a sidewall 402, and a metal silicide 404. An adhesion layer 405 is formed in order to increase adhesion between a contact 406 and an inter-layer dielectric film 408 to prevent its peeling off.

Figure 5:
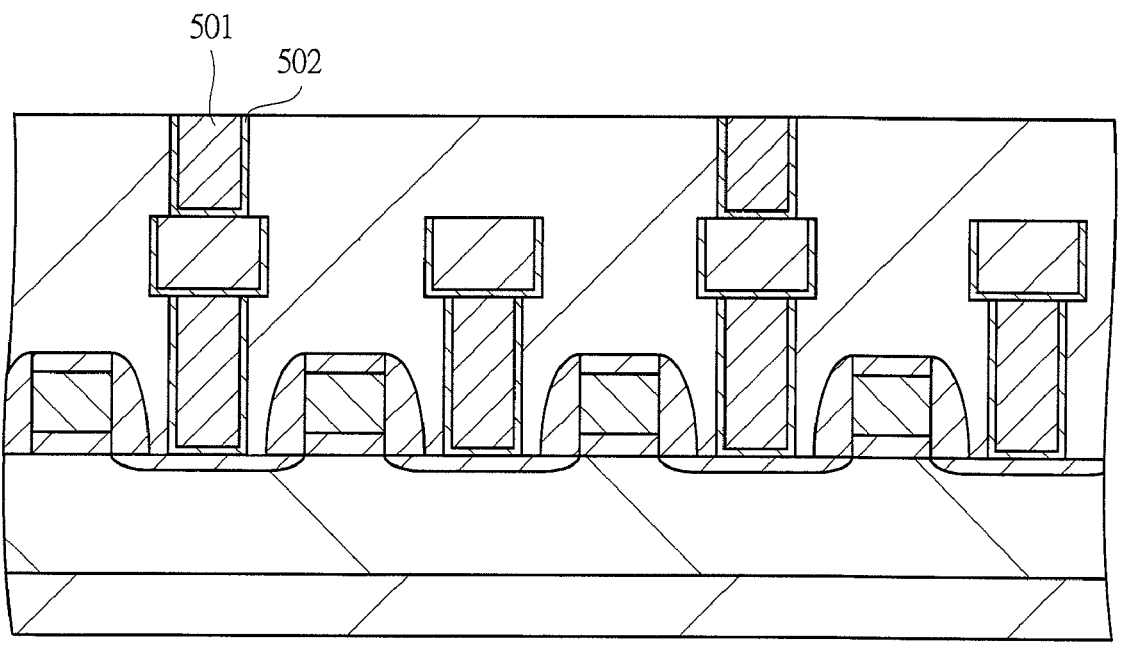
FIG. 5 is another sectional view of a principal part of the storage device according to the first embodiment of the present invention.

Next, as shown in the cross sectional view of the principal part in FIG. 5, a contact hole is formed and an adhesion layer 502 and a plug 501 are formed in the contact hole by chemical vapor deposition (CVD) method. TiN is used as a composition of the adhesion layer 502, and W is used as a composition of the plug material.

Figure 6:
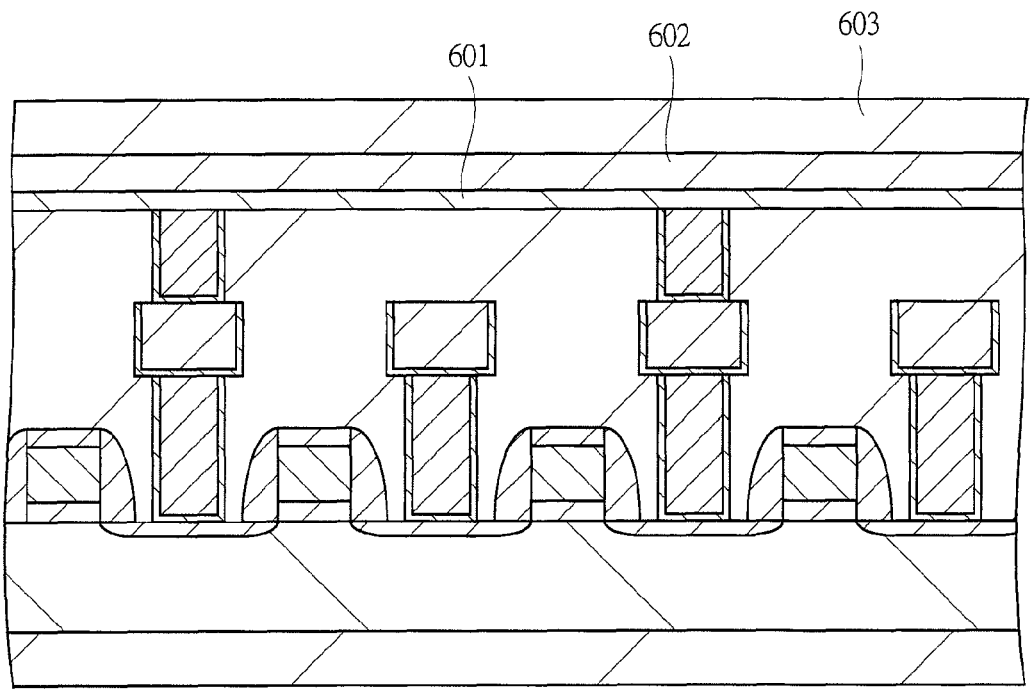
FIG. 6 is still another sectional view of a principal part of the storage device according to the first embodiment of the present invention.

Further, as shown in the cross sectional view of the principal part in FIG. 6, a lower electrode 601 and a chalcogenide 602 are deposited by sputtering or vacuum vapor deposition, and then, an inter-layer dielectric film 603 is formed. For a composition of the chalcogenide, an alloy of Ge—Sb—Te which is widely proven in a recording-type optical disk or a material obtained by adding additives in the alloy is suitable.

Figure 7:
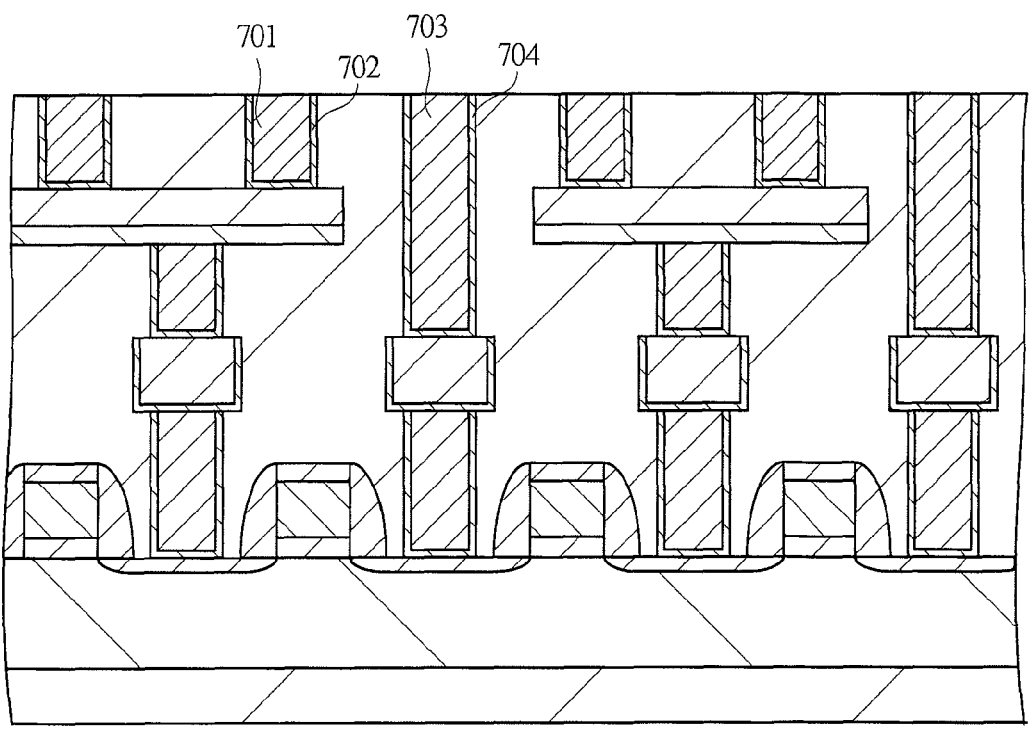
FIG. 7 is still another sectional view of a principal part of the storage device according to the first embodiment of the present invention.

Next, as shown in the cross sectional view of the principal part in FIG. 7, a contact hole is formed, and an adhesion layer 702 and an upper electrode plug 701 contacted to the phase change film are formed in the contact hole by chemical vapor deposition (CVD) method. W can be used as a material of the upper electrode plug.

Further, as shown in the cross sectional view of the principal part in FIG. 7, a contact hole is formed, and an adhesion layer 704 and a contact plug 703 for connecting between the upper electrode plug 701 contacted to the phase change film and the diffusion layer of the transistor are formed in the contact hole by chemical vapor deposition (CVD) method.

Figure 8:
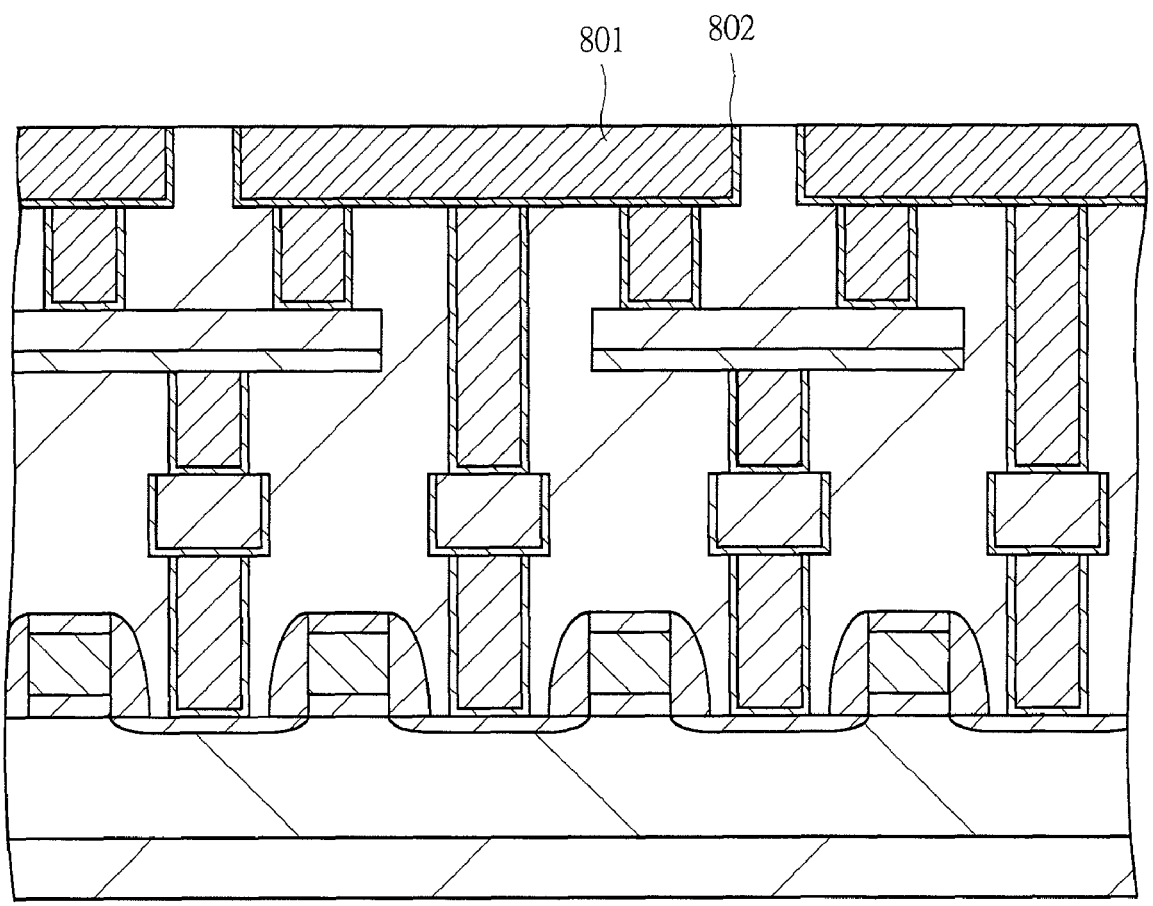
FIG. 8 is still another sectional view of a principal part of the storage device according to the first embodiment of the present invention.

Still further, as shown in the cross sectional view of the principal part in FIG. 8, an adhesion layer 802 and a connecting layer 801 for connecting between the upper electrode plug and the diffusion layer of the transistor are formed.

Figure 9:
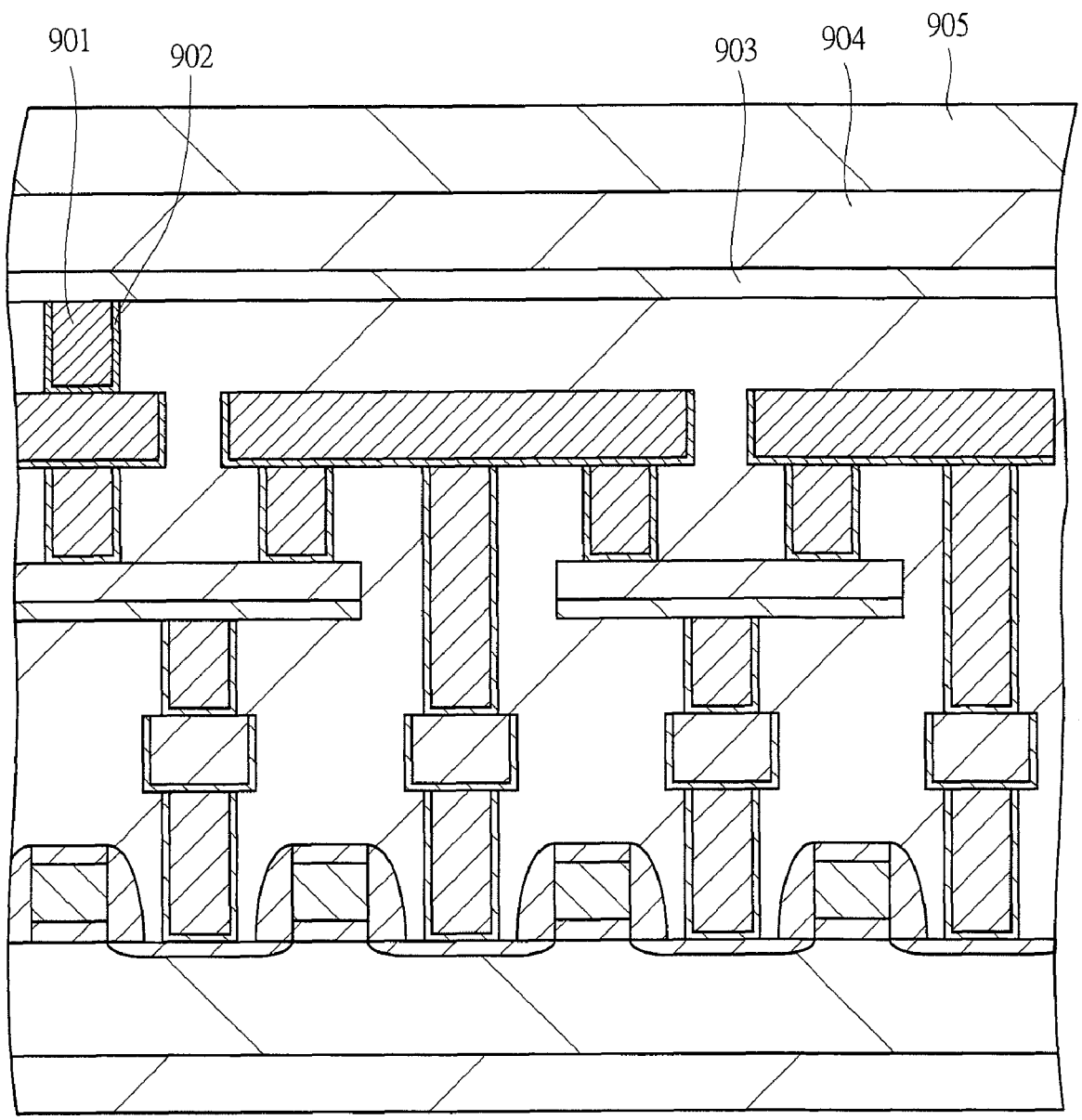
FIG. 9 is still another sectional view of a principal part of the storage device according to the first embodiment of the present invention.

Still further, as shown in the cross sectional view of the principal part in FIG. 9, after forming a contact 901 contacted to the bit line and an adhesion layer 902 thereof, a connecting layer 903 is formed, and then, a bit line 904 is deposited by sputtering. Sequentially, an inter-layer dielectric film 905 is formed, and further, an upper wire is formed, thereby capable of manufacturing a desired memory.

In the present first embodiment, it is possible to manufacture the memory as following a normal CMOS logic mixedly mounting design rule, and the present first embodiment is suitable for a manufacture of a logic mixedly mounted memory.

Figure 2A:
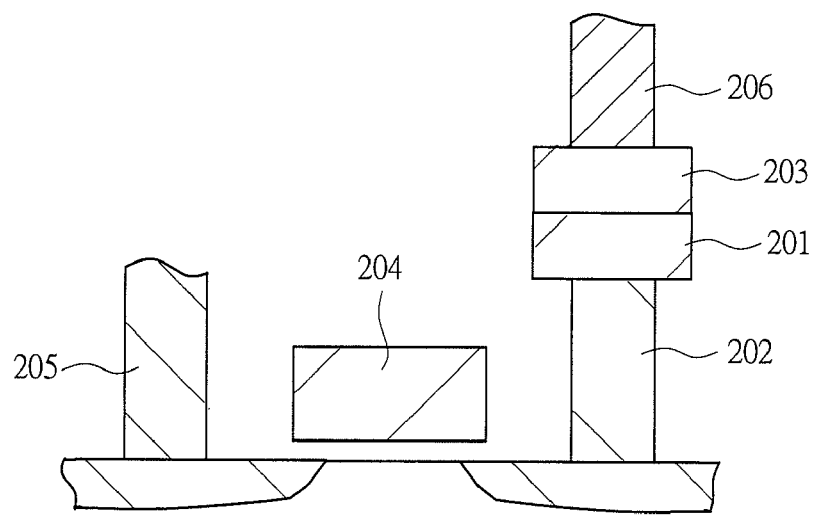
FIGS. 2A and 2B are diagrams showing a structure and a circuit of a conventional method, respectively.
Figure 2B:
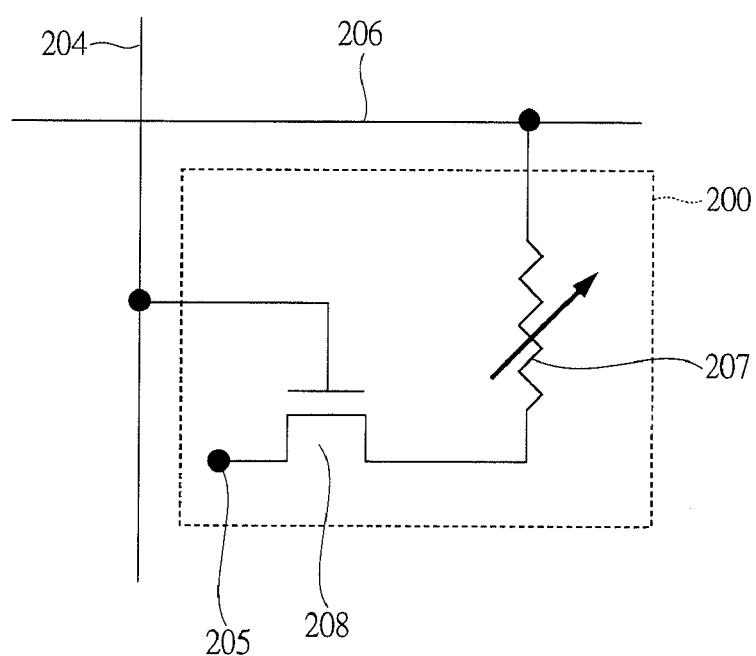

As is apparent in FIG. 1, a source electrode of the transistor connected to the storage media also serves as a drain electrode of an adjacent memory cell by using a manner of the first embodiment, and the manner is advantageous for high integration compared to a conventional structure shown in FIG. 2 in which one memory cell occupies one transistor. A size of a memory cell most highly integrated in the conventional structure shown in FIG. 2 is $8F^2$ if it is assumed that a minimum feature size is "F". Compared to this, since one transistor can be shared with the adjacent memory cells to each other in the first embodiment, an area size of the memory cell in the case of the most highly integration can be theoretically reduced down to $4F^2$. That is, a memory cell suitable for the high integration can be realized by using the structure according to the first embodiment.

A summary of the semiconductor storage device according to the first embodiment is as follows.

In a memory cell formed of the phase change region (storage device) 111 and the selecting transistor 114 shown in FIG. 1C, the phase change region 111 is formed of a device having a structure in which the phase change thin film 101 is sandwiched between the upper plug electrode (first electrode) 102 and the lower electrode (third electrode) 104 as shown in FIG. 1B. Also, the phase change region 111 is formed of a device having a pair-combined structure with the adjacent phase change region 112 which shares the lower electrode 104, and the device has a symmetrical structure putting the plug 106 on a center of the structure as shown by "113" in FIG. 1B. The phase change region 111 is formed just below the upper plug electrode 102 by carrying the writing current to the phase change thin film 101 through the upper plug electrode 102 and the lower electrode 104. Also, in the structure of this typical example, the upper plug electrode 102 shares the lower electrode 104 and the phase change thin film 101 with its adjacent cell including the upper plug electrode 103 as a second electrode. Similarly to the phase change region 111, the phase change region 112 of the adjacent cell is formed just below the upper plug electrode 103 of the adjacent cell.

The selecting transistor 114 shown in FIG. 1C is configured with diffusion layers 109 and 110, plugs 107 and 106 respectively connected to the diffusion layers 109 and 110, and a word line (gate electrode) 105 shown in FIG. 1A, and such a structure is provided that each of the diffusion layer and the plug are shared with another selecting transistor configuring its adjacent cell.

An operation of the memory cell including the selecting transistor 114 connected to the word line 105 (WL1) shown in FIGS. 1A and 1C is as follows. First, FIG. 1D shows a timing chart of a voltage pulse applied to the word line 105 (WL1). Also, current (C→D) indicates a value of current flowing in a direction from C to D between C and D in FIG. 1C.

First, all word lines including the word line 105 (WL1) are maintained at 1.5 V which is in ON state of the selecting transistor so that there is provided a state of not applying voltage to both ends of all of the phase change storage units. Next, for writing data in the phase change region 111, a voltage pulse shown in FIG. 1D is applied to the word line 105 (WL1) connected to the gate electrode of the selecting transistor 114 configuring the memory cell together with 111. When the gate voltage of the selecting transistor 114 returns back to 0 V, the selecting transistor 114 is turned to OFF state, so that the current (C→D) is flown between both ends of C and D of the phase change region (phase change storage unit) 111 connected to the selecting transistor 114 in parallel, thereby performing the writing operation of set and reset. As a result of the above-described operation, current is flown from the upper plug electrode 102 to the lower electrode 104 shown in FIG. 1A at the set operation and the reset operation. Thereby, the phase change region 111 is formed inside of the phase change thin film 101 located just below the upper plug electrode 102, and the phase change region 111 becomes the low resistance state which is crystallized after the set operation and the phase change region 111 becomes the high resistance state which is amorphized after the reset operation, so that information of "1" and "0" are written therein. The resistance values are read by the read operation shown in FIG. 1D.

FIG. 1E shows a procedure of a pulse application in a case of performing the writing operation to a cell adjacent to the phase change region (phase change storage unit) 111, that is a memory cell formed of the phase change region 112 and the selecting transistor 115. Similarly to the writing to 111, first, all of the word lines are maintained at 1.5 V, so that there is realized a state of no applying voltage to both ends of all of the phase change storage units. And then, a voltage pulse shown by voltage (WL2) in FIG. 1E is applied to a word line 108 (WL2). And then, current is made to carry in the memory cell array by using the terminals A and B so as to match the current (D→E) flowing between terminals D and E which are both ends of the phase change region 112 with the current pulse shown in FIG. 1E. As shown in FIG. 1E, current having a reverse direction of the writing to the phase change region 111 is flown between the terminals A and B.

By performing the writing operation to the phase change region (phase change storage unit) 112 as described above, current in the phase change region 112 is flown from the upper plug electrode 103 to the lower electrode 104, so that the writing operation is performed under a similar condition to that of the phase change region 111 on a structure of an actual cell.

There is a method of adjusting heights of the current pulses shown in FIGS. 1D and 1E, that is, magnitudes of the writing and reading currents, by the magnitude of the voltage applied to the terminals A and B at both ends of the memory cell array shown in FIG. 1C as constantly maintaining the height of the current pulse applied to the word line of the selected cell.

While the currents flowing between the terminals A and B have reverse directions when adjacent cells are compared to each other at the writing, the currents flowing between the terminals A and B may have same directions at the reading.

Preferably, the ON resistance of the selecting transistor has a small value which is negligible compared to the resistance value of the low resistance state of the phase change storage unit.

Preferably, the material of the phase change device is chalcogenide.

Second Embodiment

Regarding a memory cell having a structure not required for switching the direction of the current carry when the adjacent cell is selected to perform the writing operation in spite of having a configuration of the same equivalent circuit as that of the first embodiment, a description thereof will be described below.

Figure 10:
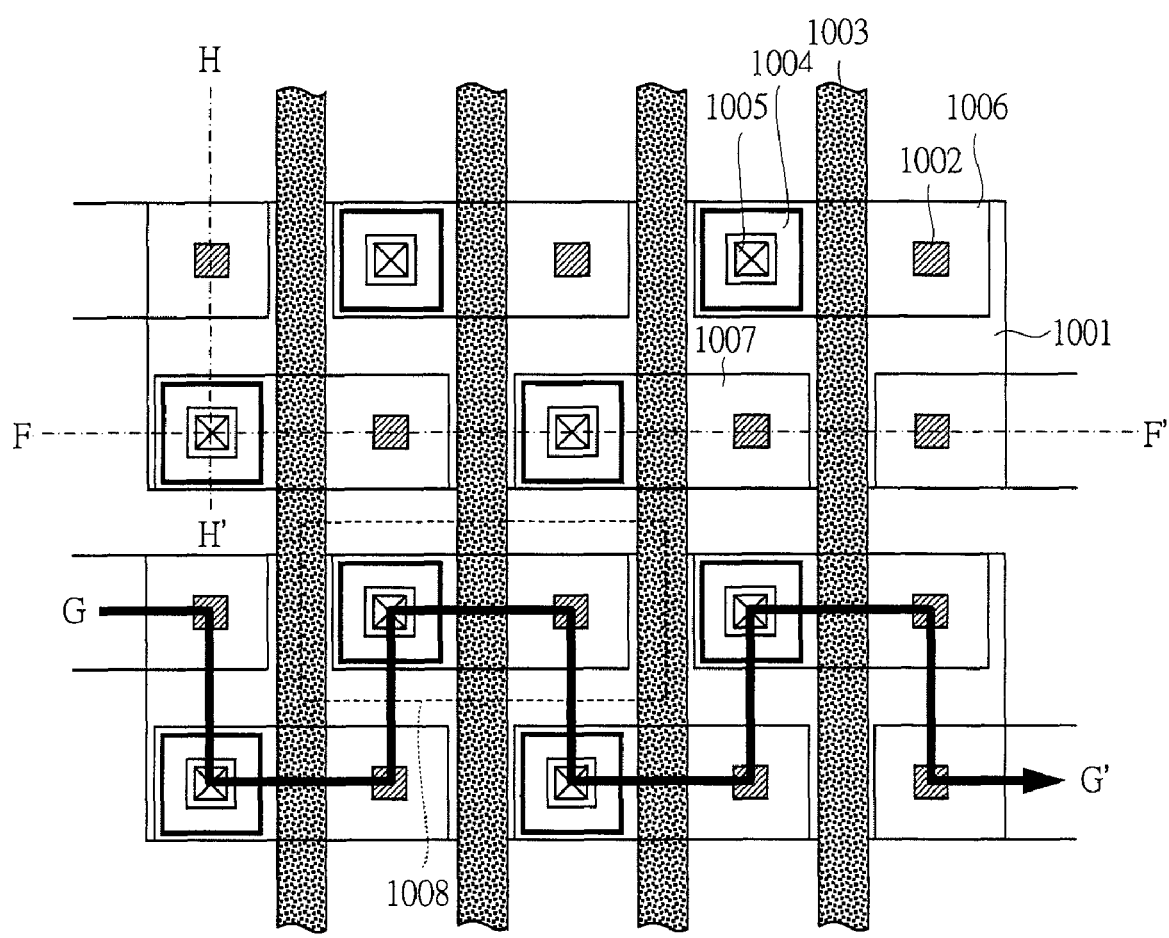
FIG. 10 is a layout diagram of a principal part of the storage device according to a second embodiment of the present invention.
Figure 11:
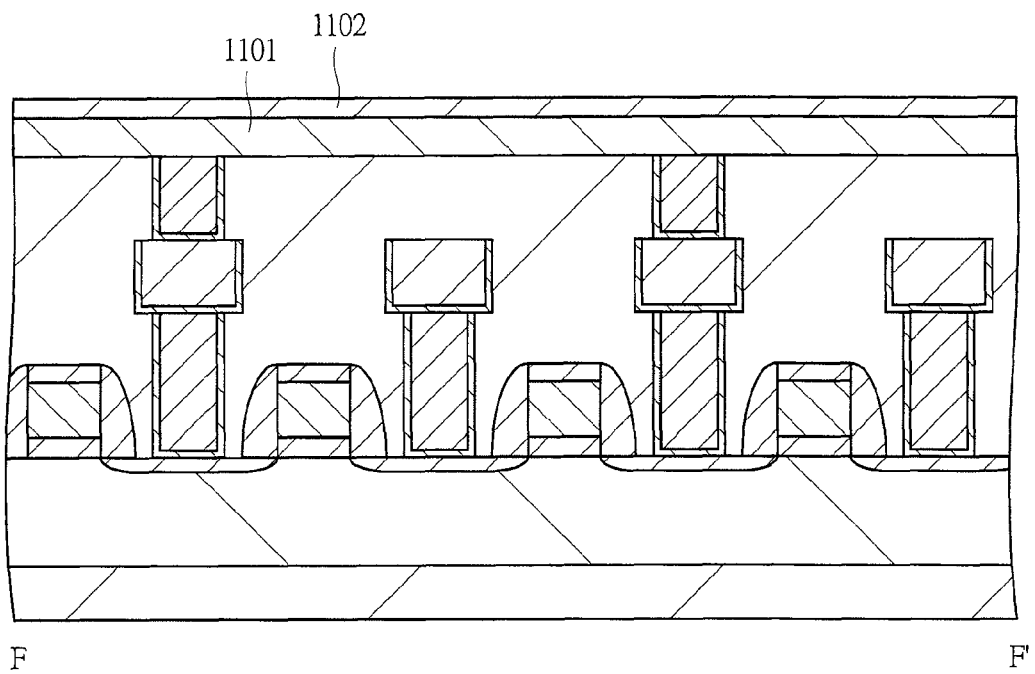
FIG. 11 is a sectional view of a principal part of the storage device according to the second embodiment of the present invention.

FIG. 10 shows a layout of a principal part of a memory cell according to a second embodiment. Such a structure is manufactured that a plug 1005 contacted to a chalcogenide 1004 and a plug 1002 contacted to a diffusion layer of a transistor have a word line 1003 therebetween and are connected by a wiring layer 1006 inside an active region 1001 to form one memory cell. If it is assumed that a minimum feature size is "F", a distance between adjacent word lines is 2F.

The above-described memory cell is connected in series to a memory cell including a wiring layer 1007 adjacent thereto manufactured inside the same active region 1001 via the diffusion layer, so that a memory cell array equal to the equivalent circuit shown in FIG. 1B is formed as tracking a route indicated by line G-G'.

Cross sectional views of principal parts of portions shown by line F-F' in the layout diagram of the principal part shown in FIG. 10 are shown in FIGS. 11 to 15. After forming the plug 501 by using processes of having the same structure as that of the cross section shown in FIG. 5 in a vertical direction, a chalcogenide layer 1101 and an upper electrode 1102 are formed by using sputtering or vacuum vapor deposition method. In the present embodiment, the plug 501 configures the lower electrode of the phase change storage unit differing from that of the first embodiment.

Figure 12:
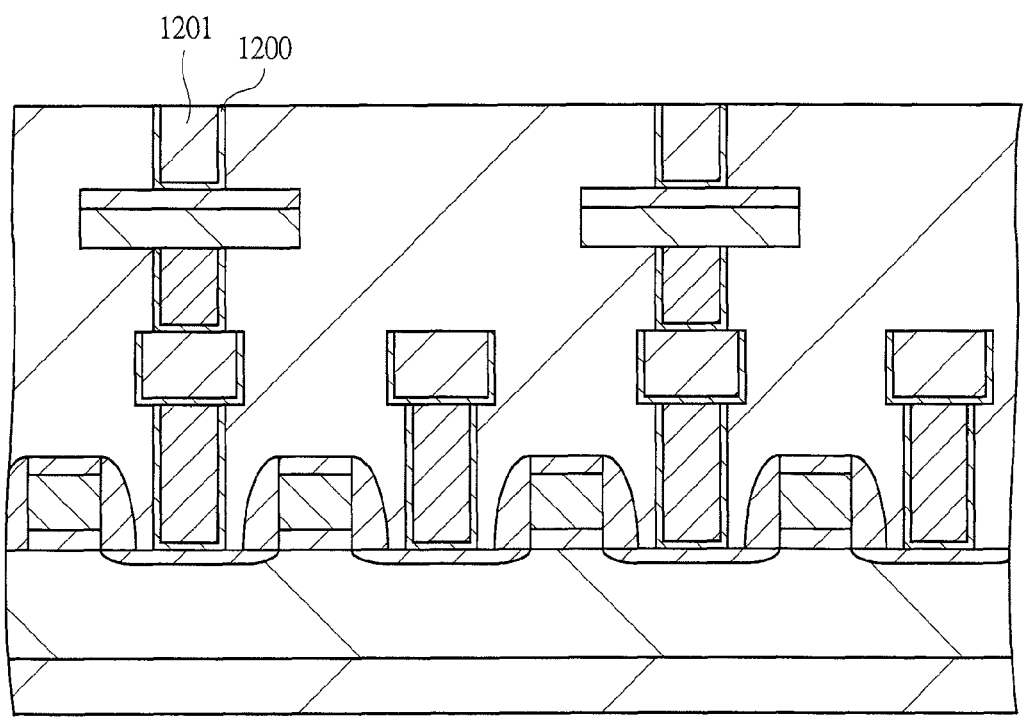
FIG. 12 is another sectional view of a principal part of the storage device according to the second embodiment of the present invention.
Figure 13:
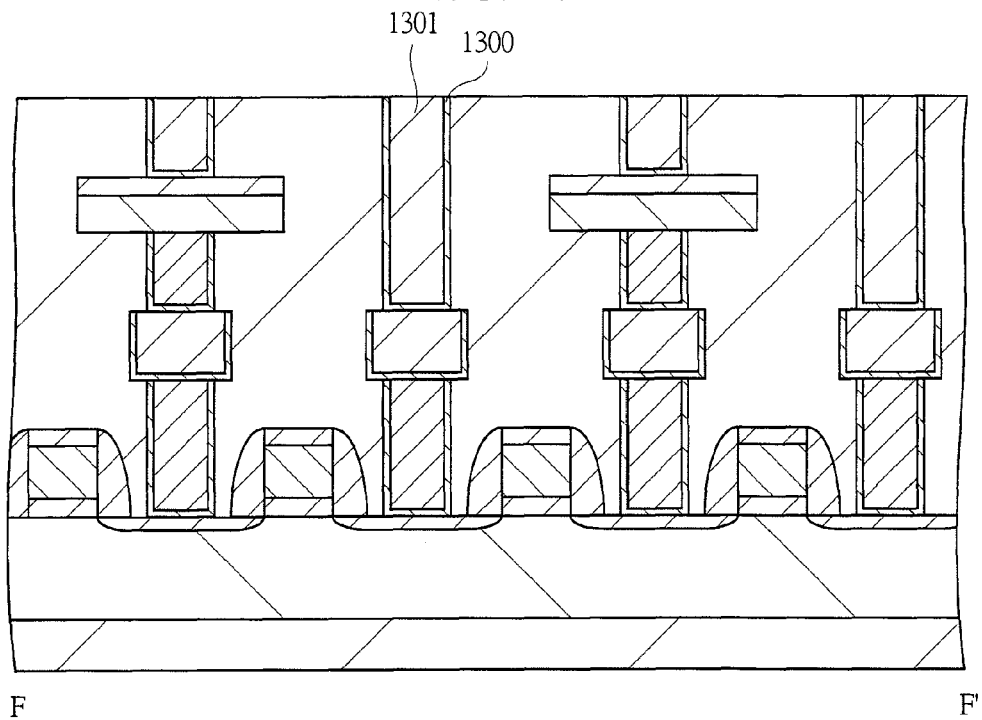
FIG. 13 is still another sectional view of a principal part of the storage device according to the second embodiment of the present invention.
Figure 14:
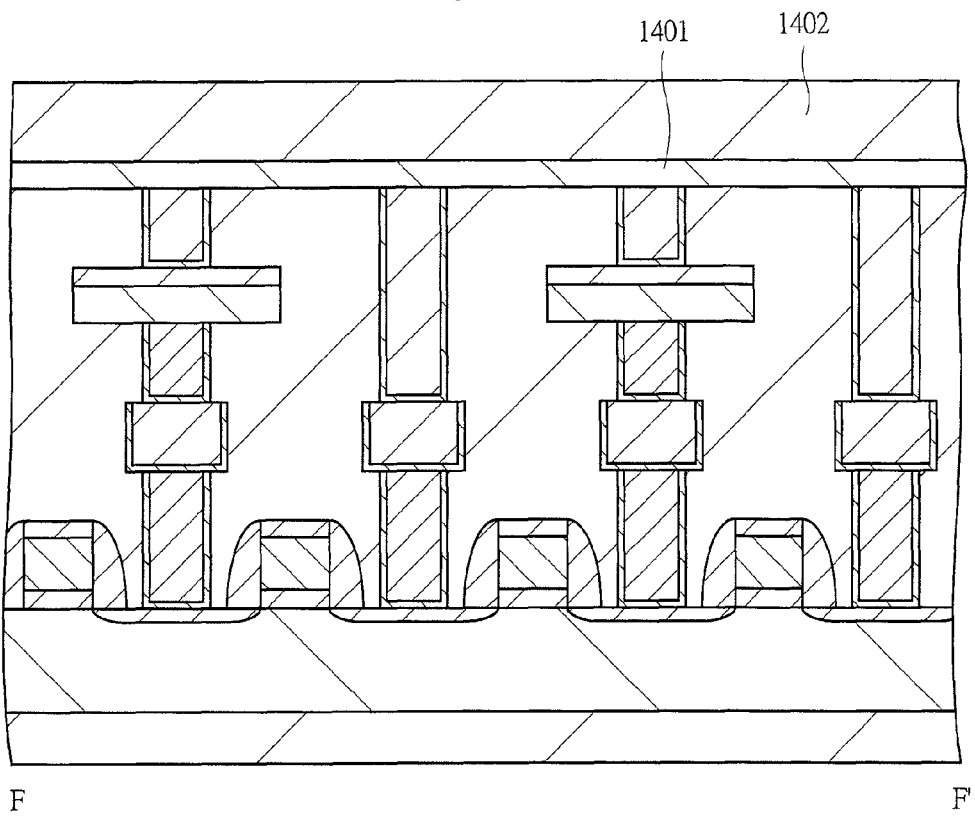
FIG. 14 is still another sectional view of a principal part of the storage device according to the second embodiment of the present invention.
Figure 15:
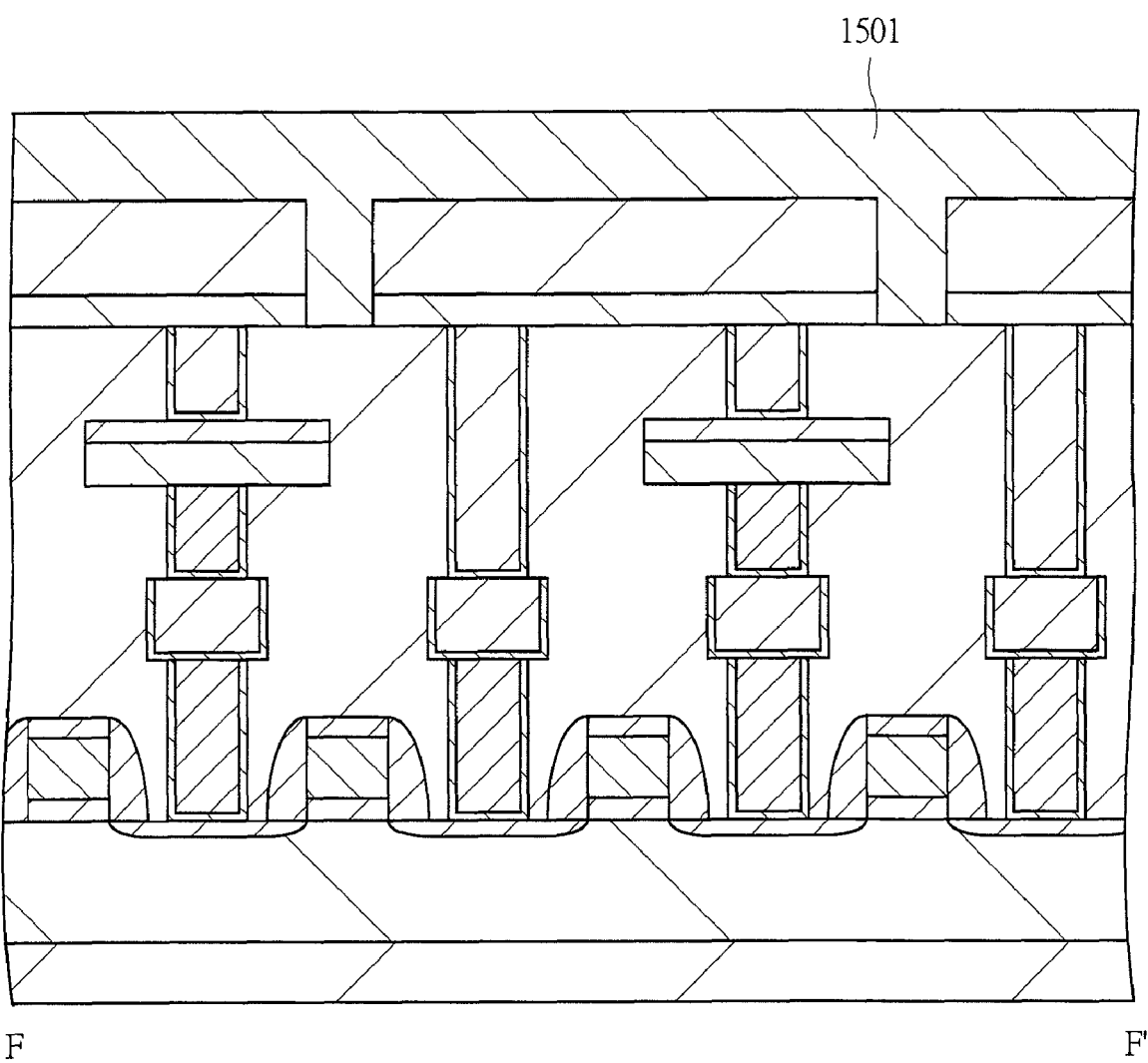
FIG. 15 is still another sectional view of a principal part of the storage device according to the second embodiment of the present invention.

FIG. 12 shows a structure in which the phase change film and the upper electrode are processed and a plug 1201 for contacting to a wiring layer is formed thereon, and FIG. 13 shows a structure in which a plug 1301 for contacting to a diffusion layer without interposing the phase change film is formed. And then, a connecting layer 1401 and a wiring layer 1402 are formed as shown in FIG. 14 and are processed as shown in FIG. 15, and then, a protective film 1501 is formed, thereby completing a structure of a main portion of the memory cell. Note that processes for manufacturing the structures shown in FIGS. 11 to 15 are similar techniques to that used for manufacturing the structure of the first embodiment, and those details are omitted.

Figure 16:
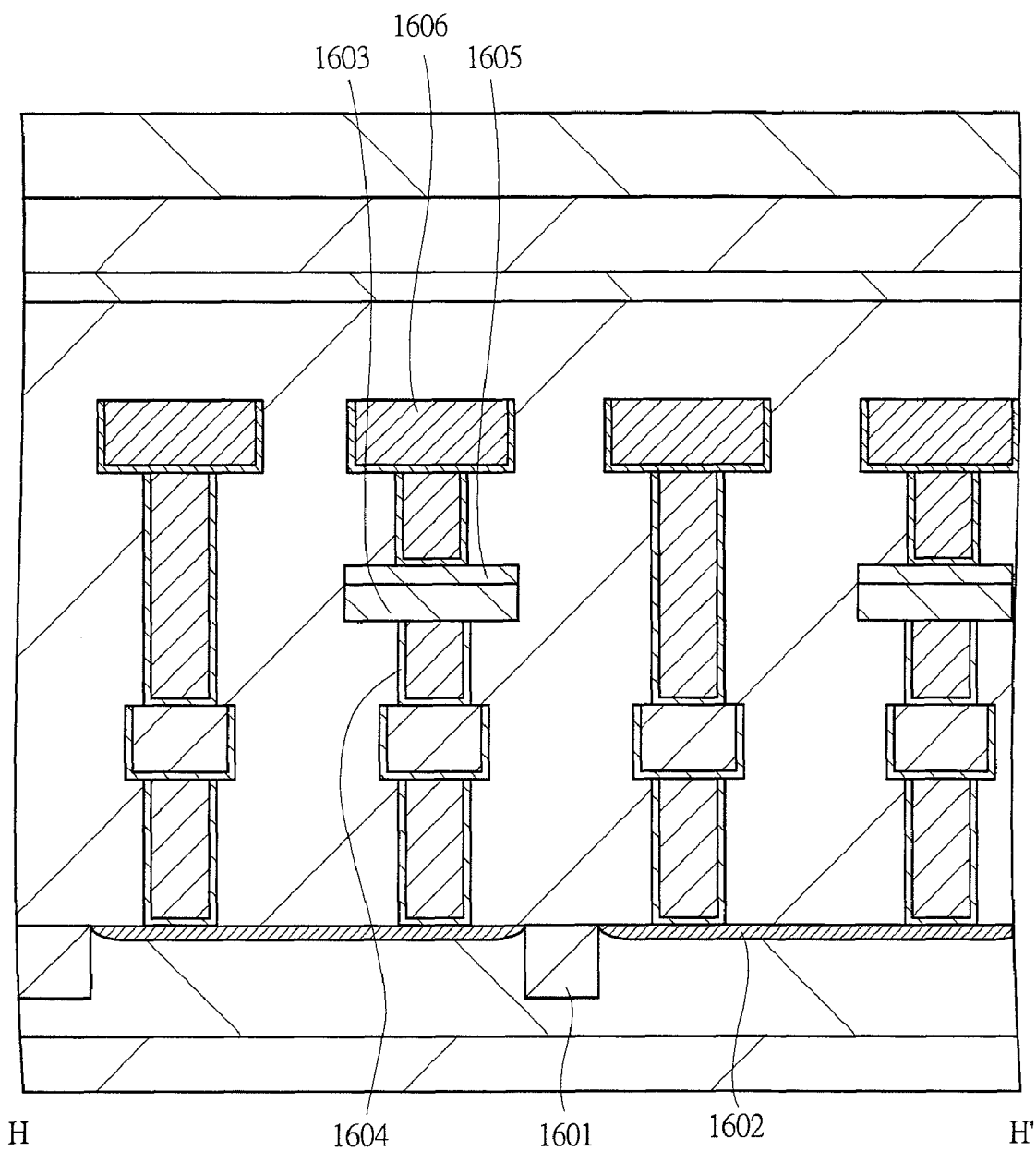
FIG. 16 is still another sectional view of a principal part of the storage device according to the second embodiment of the present invention.

FIG. 16 shows a cross sectional structure indicated by line H-H' which is a cross section in a direction of the word line 1003 in FIG. 10. It can be confirmed that there is provided an SGI (shallow groove isolation) structure 1601 for device isolation isolating a diffusion layer 1602 and the active region in the memory cell array from each other on a substrate. As a main portion of the memory cell, "1603" indicates a phase change film, "1604" indicates a lower electrode plug connected to the phase change film, "1605" indicates an upper electrode, and "1606" indicates a wiring layer for connecting a phase change storage unit.

A difference of the structure of the memory cell of the second embodiment from that of the first embodiment becomes apparent from comparison of FIGS. 9 to 15. In the structure of the first embodiment, as shown in FIG. 9, it is found that cells adjacent to each other are arranged so as to have a physically symmetrical structure as putting a boundary line between both cells to a center. This symmetrical structure is a reason for causing the requirement of applying the current pulse with opposite polarity when the writing operation is performed to the adjacent cell as shown in FIG. 1C. Compared to this, since memory cells adjacent to each other have exactly the same structure in the structure of the second embodiment as shown in FIG. 15, it is unnecessary to change the polarity of the writing current for each adjacent cell.

By using the structure of the second embodiment as described above, simplification of the writing operation is possible even if a degree of integration of the memory cell thereof is inferior to that of the structure shown in the first embodiment so that a circuit configuration for driving the memory cell is simplified. Accordingly, the structure of the second embodiment is suitable for a device having a slightly smaller memory capacity than that of the first embodiment.

On the other hand, in the second embodiment, device isolation required for each memory cell in the conventional phase change memory cell having one cell configured with one transistor+one phase change device is unnecessary as is apparent from the layout diagram shown in FIG. 10. Normally, when a minimum feature size is denoted by F, an area size of approximately $2F^2$ for each one memory cell is required in order to manufacture an SGI (shallow groove isolation) structure for device isolation between memory cells, and therefore, an occupation area per memory cell becomes correspondingly large. Accordingly, when the structure of the second embodiment is used, it is possible to manufacture an inexpensive phase change memory with realizing the higher integration than that of the memory having the conventional structure.

Further, as is apparent from a plan arrangement diagram shown in FIG. 10, a gate width of the MOS transistor can be equal to or wider than twice of that of the arrangement of the ordinary memory cell array according to the structure of the second embodiment. That is, in the first embodiment, the gate width of the MOS transistor becomes equal to the width of the active region 301 of the memory cell as shown in FIGS. 3A to 3D. The gate width becomes the same size even in the arrangement generally used for the memory cell array with the conventional structure shown in FIG. 2. Compared to this, the width of the active region 1001 in FIG. 10 is equal to or wider than twice of the active region 301 shown in FIG. 3 so that the gate width of the MOS transistor becomes correspondingly large, thereby reducing the ON resistance. That is, by using the structure of the second embodiment, constraints of the ON resistance required for the MOS transistor defined by Equation (9) can be satisfied more easily than that of the other structures even in a case of manufacturing a fine memory cell so as to be highly integrated.

Also, in the memory cell with the conventional structure such as shown in FIG. 2, a current driving ability of the MOS transistor per memory cell becomes a problem when the memory cell is highly integrated. As a result, the size of the MOS transistor cannot be made small, and therefore, there is an indication about such a possibility that microfabrication of the whole memory cell becomes difficult. Compared to this, according to the structure of the second embodiment, as reducing the occupation area per memory cell even if the same microfabrication technique and the same phase change device are used, the current driving ability of the MOS transistor can be contrarily increased two times the memory cell with the conventional structure or more. That is, it is found that the use of the structure of the second embodiment becomes a hopeful mean for solving the problem of the current driving ability of the selected MOS transistor which becomes serious when the microfabrication technique is advanced in the future.

Third Embodiment

Figure 17:
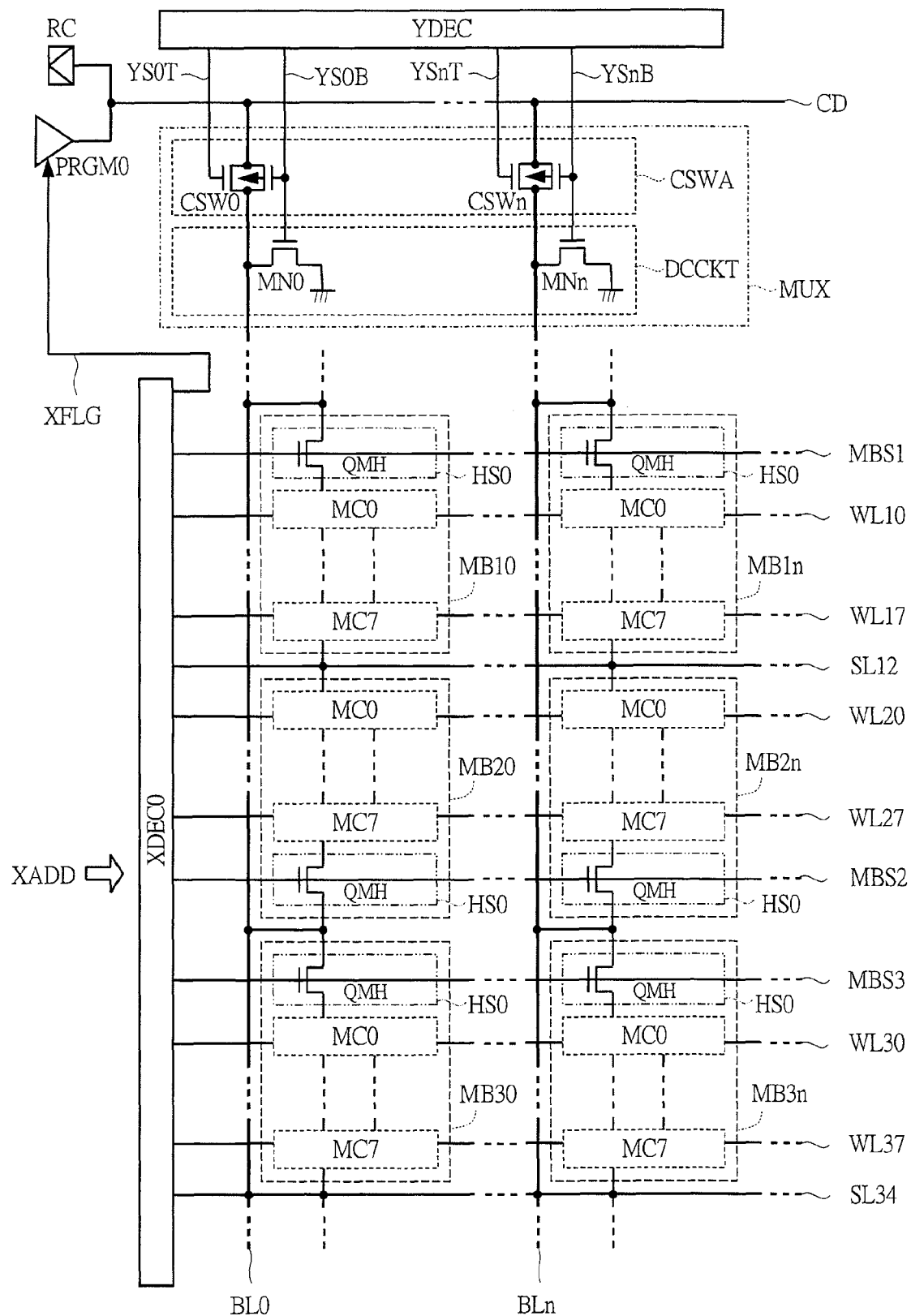
FIG. 17 is a diagram showing a configuration example of a phase change memory array in a semiconductor information storage device according to a third embodiment of the present invention.

FIG. 17 shows a schematic diagram of a configuration of a phase change memory according to a third embodiment. That is, the phase change memory is configured with a memory array, a multiplexer MUX, a row decoder XDEC, a column decoder YDEC, a reading circuit RC, and a rewriting circuit PRGM0. The memory array is configured with memory blocks MB00 to MBmn configured with a plurality of memory cells. In the same figure, memory blocks configured with eight memory cells MC0 to MC7 is shown as one example. Each of the memory cells is arranged at each intersection of bit lines BL0 to BLn and word lines WL00 to WL07, . . . , WLm0 to WLm7 to be destinations of output signals from the row decoder XDEC0 and between the bit lines BL0 to BLn and source lines (here, SL12 and SL34). Each of the source lines is shared by memory blocks adjacent to each other. The memory block further includes a hierarchy switch HS0 inserted between a bit line and a memory cell. The hierarchy switch HS0 is configured with an NMOS transistor QMH in which a gate electrode is connected to one of memory block selecting signals MBS0 to MBSm which are output signals of the row decoder XDEC0, and it is connected such that a current path between the drain and the source is included in a current path between the bit line and the memory cell.

The multiplexer MUX is configured with a column selecting switch array CSWA and a discharge circuit DCCKT. The column selecting switch array CSWA is configured with CMOS transmission gates CSW0 to CAWn inserted between the bit lines BL0 to BLn and a common data line CD, respectively. Column selecting line pairs (YS0T, YS0B) to (YSnT, YSnB) to be output signals of the column decoder YDEC are connected to gate electrodes of the CMOS transmission gates CSW0 to CAWn, respectively. By an activation of one of the column selecting line pairs (YS0T, YS0B) to (YSnT, YSnB), a CMOS transmission gate corresponding thereto is activated so that one of the bit lines BL0 to BLn is connected to the common data line CD. The discharge circuit DCCKT comprises NMOS transistors MN0 to MNn inserted between the bit lines BL0 to BLn and a ground voltage VSS terminal, respectively. Column selecting lines YS0B to YSnB are connected to gate electrodes of the NMOS transistors MN0 to MNn, respectively. By maintaining the column selecting lines YS0B to YSnB at the power source voltage VDD in stand-by, the NMOS transistors MN0 to MNn are turned on so that the bit lines BL0 to BLn are driven to the ground voltage VSS. Each of the reading circuit RC and the rewriting circuit PRGM0 are connected to the above-mentioned common data line CD. Also, a row address determining signal XFLG to be an output of the row decoder XDEC0 is connected to the rewriting circuit PRGM0.

Figure 18:
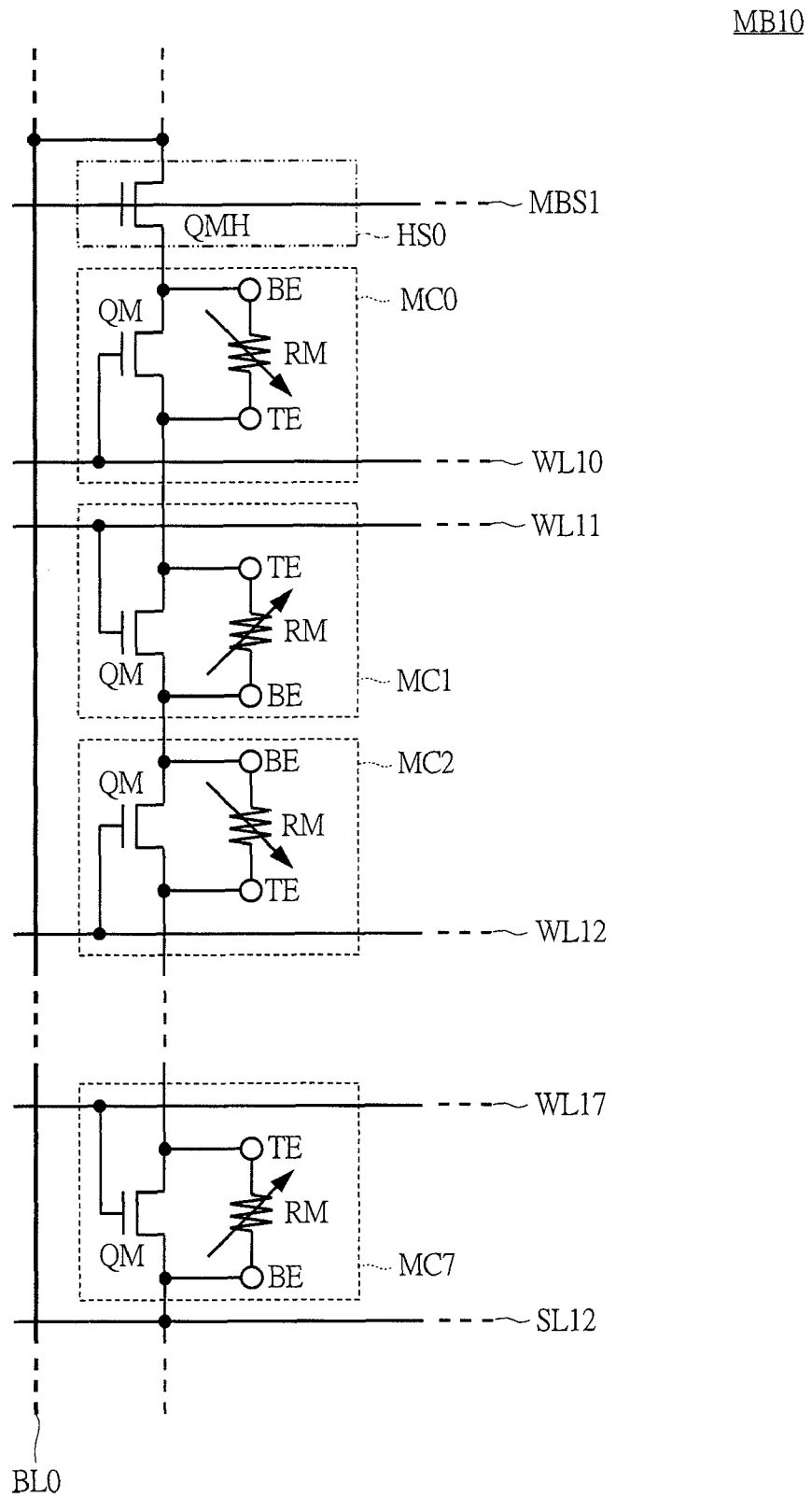
FIG. 18 is another diagram showing the configuration example of the phase change memory array in the semiconductor information storage device according to the third embodiment of the present invention.

FIG. 18 shows a specific example of a configuration of the memory cell and the memory block shown in FIG. 17. Each of the memory cells MC0 to MC7 have a configuration in which a storage device RM and a selecting transistor QM are connected in parallel. And, each of the memory cells is connected in series to each other. Here, two terminals of the storage device RM are distinguished from each other by naming as an upper electrode "TE" and a lower electrode "BE" in order to correspond to the structures shown in FIGS. 1 and 15. In a connection of adjacent cells to each other, one upper electrode TE of the storage device RM is connected to the other upper electrode or one lower electrode BE thereof is connected to the other lower electrode (a specific configuration will be described later).

Figure 19A:
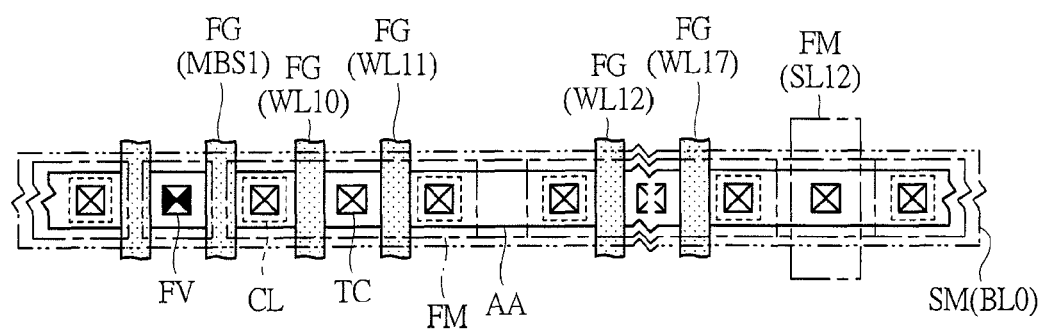
FIGS. 19A and 19B are another diagrams each showing the configuration example of the phase change memory array in the semiconductor information storage device according to the third embodiment of the present invention.

FIG. 19A shows a layout diagram of the memory block shown in FIG. 18. The layout is characterized that a via and a contact for connecting the bit line and the source line to the memory block are shared by memory blocks adjacent to each other. "AA" indicates a pattern showing an active region to be a current path of the NMOS transistor. "FG" indicates a pattern showing the gate electrode of the NMOS transistor and corresponds to a memory block selecting signal MBS1 and word lines WL10 to WL17 in the circuit diagram shown in FIG. 18. "FM" indicates a pattern showing a first metal layer and corresponds to a source line SL12. "SM" indicates a pattern showing a second metal layer and corresponds to a bit line BL0. "FV" indicates a pattern showing a first via for connecting the first metal layer and the second metal layer. "CL" indicates a pattern showing the chalcogenide film and corresponds to the storage device RM. "TC" indicates a pattern showing an upper contact formed on an upper portion of the chalcogenide film. Note that, in FIG. 19A, a pattern showing a contact formed on a lower portion of the chalcogenide film is omitted for simplification.

Figure 19B:
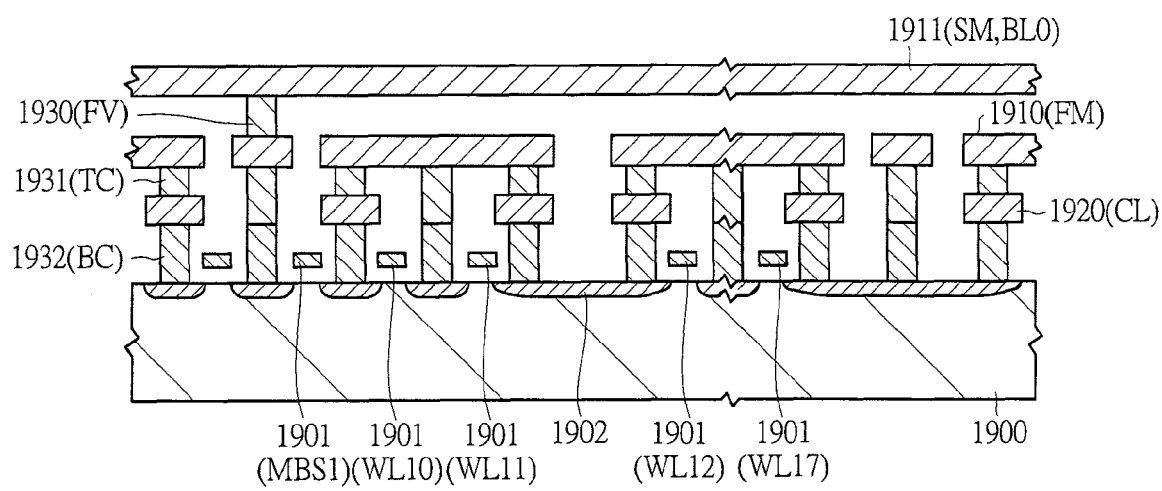

FIG. 19B further shows a cross sectional structure corresponding to the layout diagram. "1900" indicates a p-type semiconductor substrate or a p-well, "1901" indicates the gate electrode of the NMOS transistor, and "1902" indicates an n-type diffusion layer to be the source electrode and the drain electrode of the NMOS transistor. "1910" indicates the first metal layer and "1911" indicates the second metal layer. "1920" indicates the chalcogenide film. "1930" indicates the first via for connecting the first metal layer and the second metal layer, and "1931" indicates the upper contact for connecting the first metal layer and the chalcogenide film. "1932" indicates the lower contact for connecting the upper contact or the chalcogenide film to the source or drain voltage of the NMOS transistor. The chalcogenide films (that is, the storage devices RM) in memory cells adjacent to each other are connected via the first metal layer or the p-type diffusion layer of the NMOS transistor. Based on the characteristics, the connection of adjacent cells to each other is provided such that one upper electrode TE of the storage device RM is connected to the other upper electrode or one lower electrode is connected to the other lower electrode in the circuit diagram shown in FIG. 18.

In the layout and the cross sectional structure shown above, the via and the contact for connecting the bit line and the source line to the memory block are shared by memory blocks adjacent to each other. The device isolation region inside of the memory array can be removed by such a structure so that the area size of the memory array can be suppressed.

Figure 20:
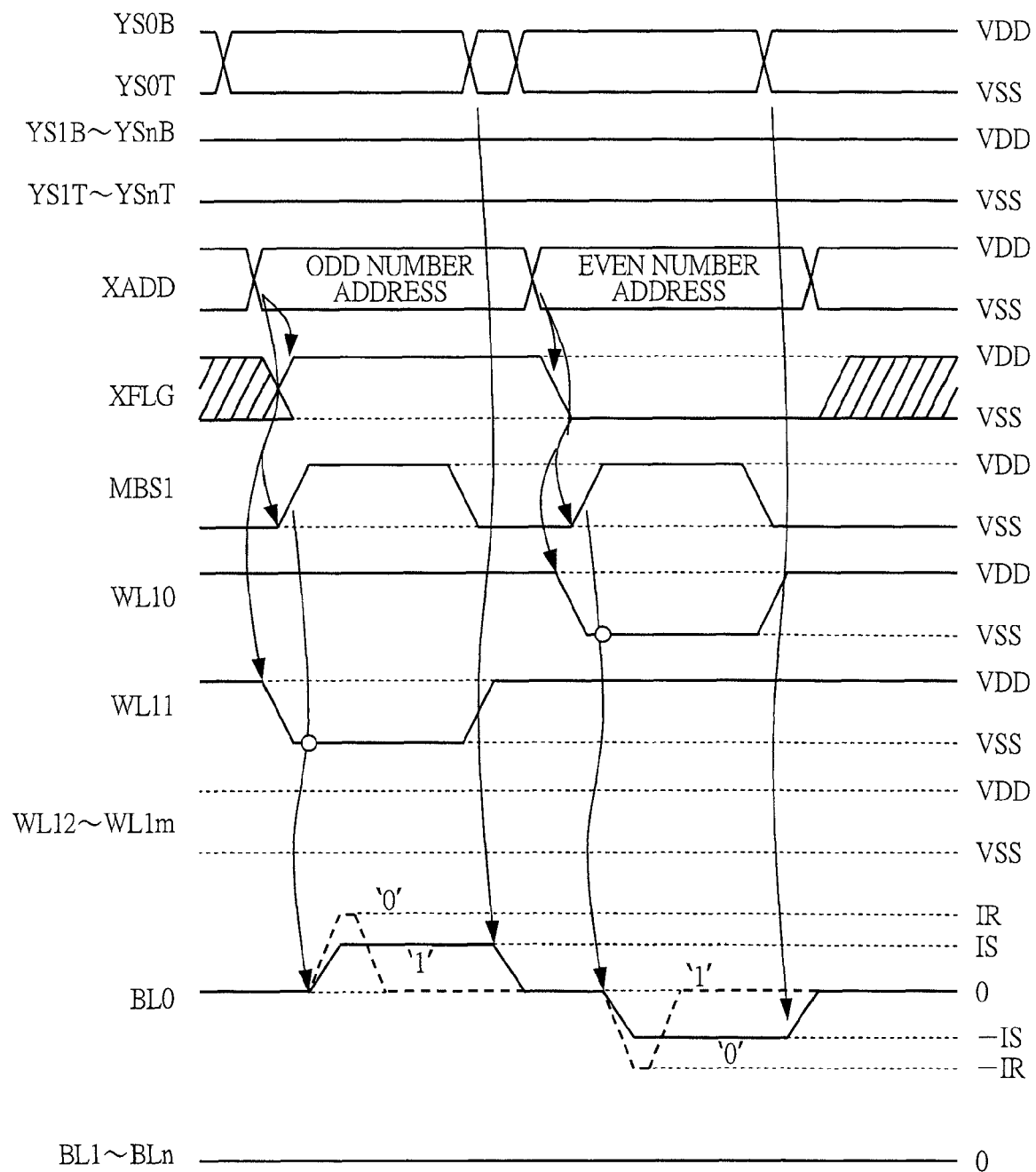
FIG. 20 is a diagram showing one example of a timing diagram in a writing operation of the phase change memory array of FIG. 17.

FIG. 20 shows the writing operation of the memory array shown in FIG. 17. In the following, an explanation is made by using an assumption that a memory cell inside of a memory block MBS10 is selected. First, the column selecting switch CSW0 corresponding to the column selecting line pairs (YS0T, YS0B) selected by the column decoder YDEC is turned on so that the bit line BL0 and the common data line CD are connected to each other. Next, a selecting operation of the row system is performed according to transition of the row address XADD. As shown in FIG. 20, when a word line WL11 corresponding to an odd number address is selected, the word line WL11 maintained at the power source voltage VDD is driven to the ground voltage VSS so that a selecting transistor QM in a memory cell MC1 is cut off, thereby forming a current path flowing through selecting transistors QM in unselected memory cells MC0 and MC2 to MC7, and the storage device RM in the selected memory cell MC1. Sequentially, a memory block selecting signal MBS1 maintained at the ground voltage VSS is driven to the power source voltage VDD so that the NMOS transistor QMH in the hierarchy switch HS0 is turned on to connect between the bit line and the memory block MB1, thereby flowing a rewriting current in the storage device in the selected memory cell MC1. Here, the row address determining signal XFLG maintained at the ground voltage VSS is driven to the power source voltage VDD according to the odd number address so that current is applied in a direction from the rewriting circuit PRGM0 toward the source line SL12 via the bit line BL0. The rewriting current is designed such that its current value and an application time thereof take values corresponding to storage information. For example, when the storage information is "0", a large reset current IR is applied for a short time. On the other hand, when the storage information is "1", a set current IS smaller than the reset current IR is applied for a longer time than that of the reset current. Finally, the memory block selecting signal MBS1 maintained at the power source voltage VDD is driven to the ground voltage VSS, and the word line WL11 maintained at the ground voltage VSS is driven to the power source voltage VDD, respectively, and the column selecting line pairs (YS0T, YS0B) are deactivated to set the transistor MN0 to be on so that the bit line BL0 is driven to the ground voltage VSS, thereby returning back to the stand-by state. By such a control, current can be applied to the storage device RM in a cell (here, the memory cell MC1) selected by the odd number row address in the direction from the upper electrode TE toward the lower electrode BE.

FIG. 20 also shows a writing operation when the word line WL10 corresponding to an even number address is selected. The word line WL10 maintained at the power source voltage VDD is driven to the ground voltage VSS so that the selecting transistor QM in the memory cell MC0 is cut off, thereby forming a current path flowing through the storage device RM in the selected memory cell MC0 and the selecting transistors QM in unselected memory cells MC1 to MC7. Here, the row address determining signal XFLG is maintained at the ground voltage VSS according to the even number address so that current is applied in a direction from the source line SL12 toward the rewriting circuit PRGM0 via the bit line BL0. By such a control, current can be applied to the storage device RM in a cell (here, the memory cell MC0) selected by the even number row address in the direction from the upper electrode TE toward the lower electrode BE. Thereby, phase-changing regions can be provided on the lower electrode BE (that is the lower contact) side in all the storage devices RM (that is the chalcogenide film) so that variations of resistance values can be suppressed.

Figure 21:
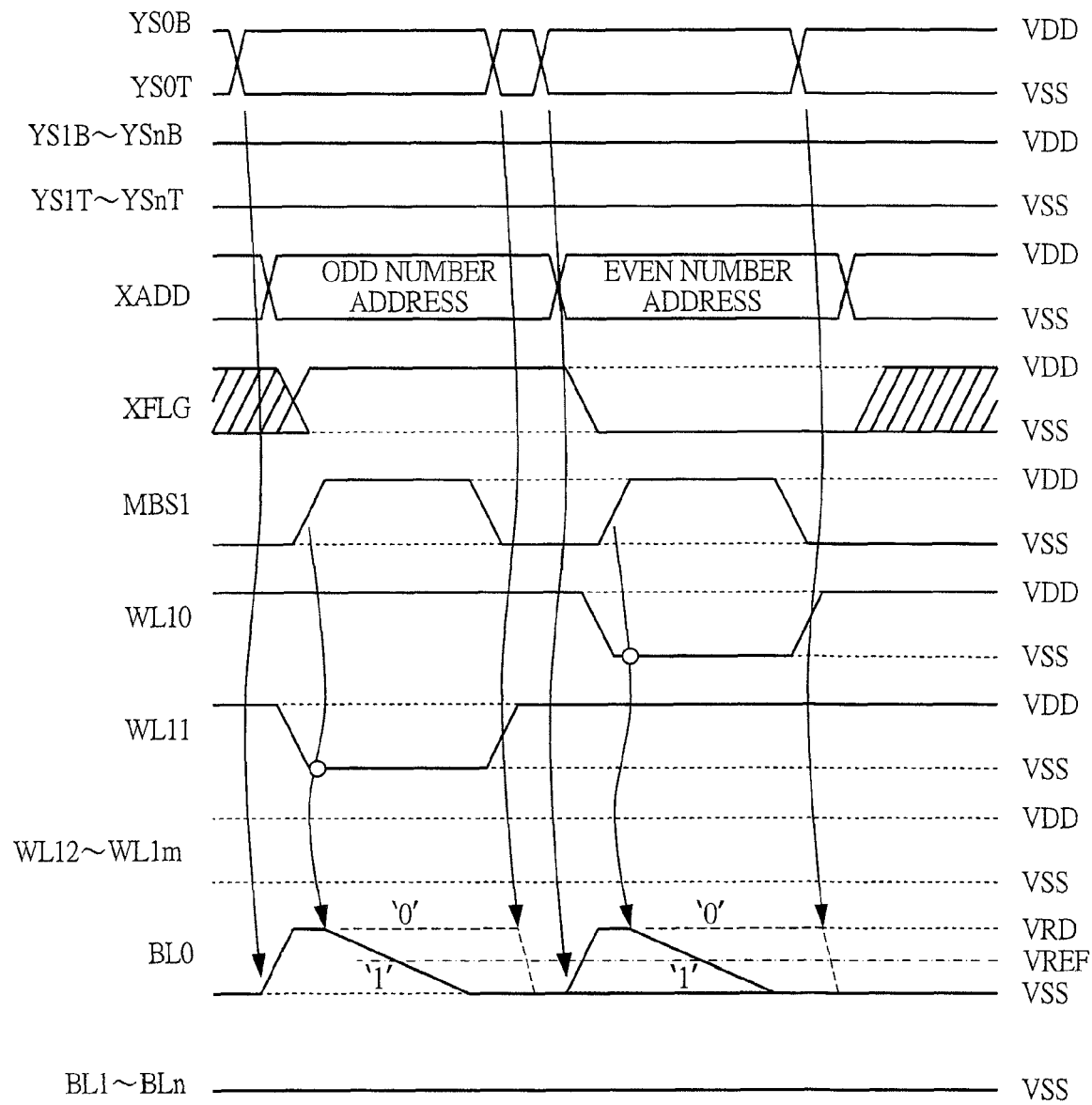
FIG. 21 is a diagram showing one example of a timing diagram in a reading operation of the phase change memory array of FIG. 17.

FIG. 21 shows a timing diagram of a reading operation in the memory array shown in FIG. 17. Even in the following, explanation is made by an assumption that a memory cell in the memory block MB10 is selected as well as the case of FIG. 20. First, the column selecting switch CSW0 corresponding to the column selecting line pairs (YS0T, YS0B) selected by the column decoder YDEC is turned on so that the common data line CD and the bit line BL0 are connected to each other, thereby performing a pre-charge of the bit line BL0 to have a reading voltage VRD by the reading circuit RC. The reading voltage VRD is designed to be set between the power source voltage VDD and the ground voltage VSS so as not to cause storage information crash. Further, the selecting transistor on the word line selected by the row decoder XDEC is cut off so that a current path is formed through the storage device RM in the selected memory cell, thereby generating a reading signal to the bit line BL0 and the common data line CD. Since the resistance value in the selected memory cell varies according to storage information, voltage outputted to the common data line CD varies according to the storage information. Here, when the storage information is "1", the resistance value in the memory cell is low so that the bit line BL0 and the common data line CD are discharged toward the ground voltage VSS to have a lower voltage than a reference voltage VREF. On the other hand, when the storage information is "0", the resistance value in the memory cell is high so that the bit line BL0 and the common data line CD are maintained at a pre-charged state, that is the reading voltage VDR. A difference of voltages is determined by the reading circuit RC so that storage information in the selected memory cell is read. Finally, the column selecting line pairs (YS0T,YS0B) is deactivated to set the transistor MNO to be on so that the bit line BL0 is driven to the ground voltage VSS, thereby returning back to the stand-by state.

Finally, an effect according to the third embodiment is described below. In the third embodiment, the via and the contact for connecting the bit line and the source line to the memory block are shared by memory blocks adjacent to each other as shown in FIG. 19 so that the device isolation region in the memory array can be removed, thereby capable of suppressing the area size of the memory array. Also, as shown in FIGS. 17 and 20, the direction of the rewriting current flowing in the bit line is controlled to the direction according to the row address by using the row address determining signal XFLG so that phase-changing regions can be provided on the lower electrode BE (that is the lower contacts) side in all the storage devices RM, thereby capable of suppressing variations of the resistance values.

Fourth Embodiment

Figure 22:
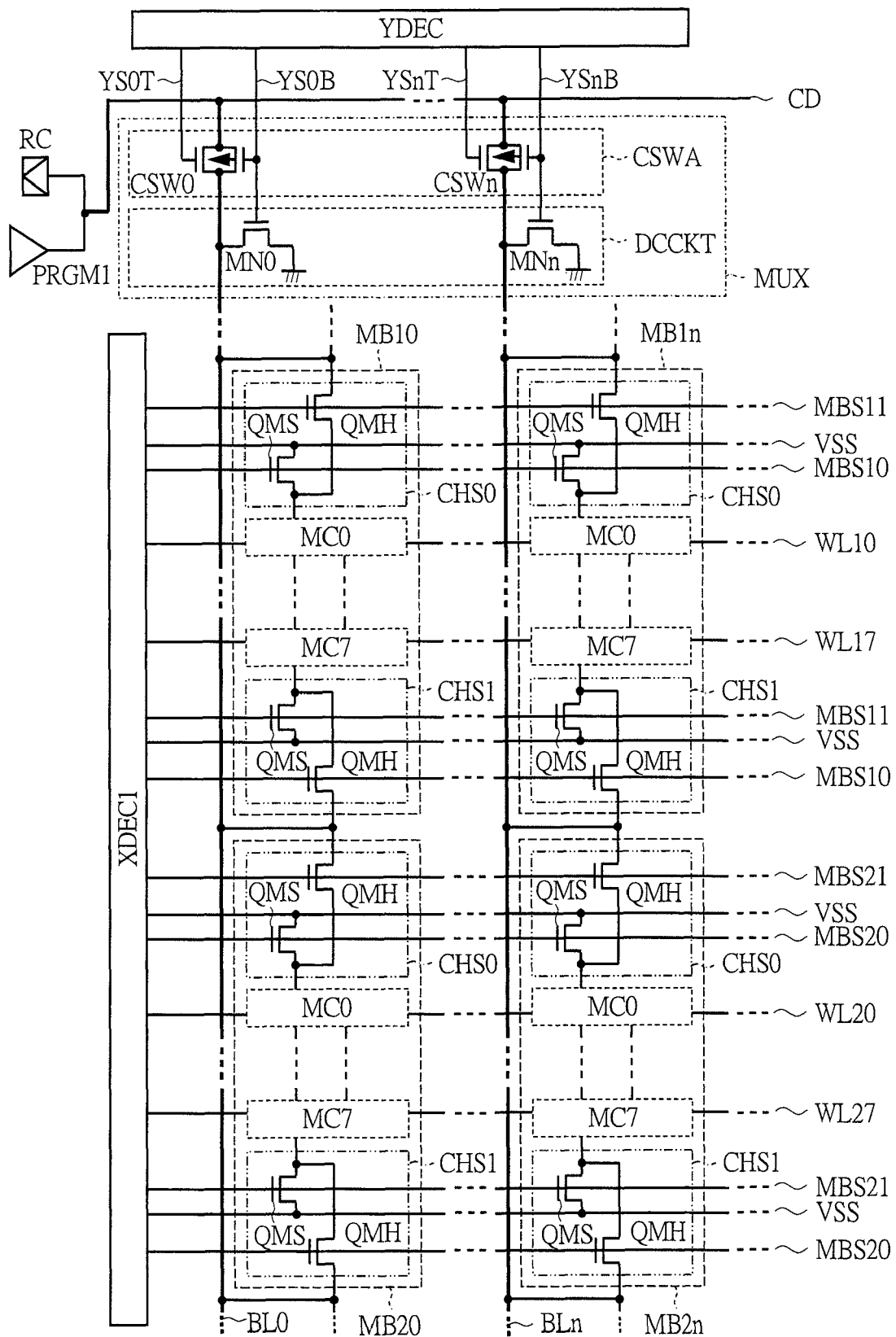
FIG. 22 is a diagram showing a configuration example of a phase change memory array in a semiconductor information storage device according to a fourth embodiment of the present invention.

In a fourth embodiment, another configuration of the memory array and an operation thereof will be explained. FIG. 22 is a schematic diagram showing a configuration of a phase change memory according to the fourth embodiment. Large differences of FIG. 22 from those of FIG. 17 are the following two points. The first one is a removal of a connection wire between a row decoder XDEC1 and a rewriting circuit PRGM1 to remove the row address determining circuit XFLG. The second one is that there is added a function of generating two signals for controlling the connection between the memory block and the bit line in each memory block to the row decoder XDEC1.

Figure 23:
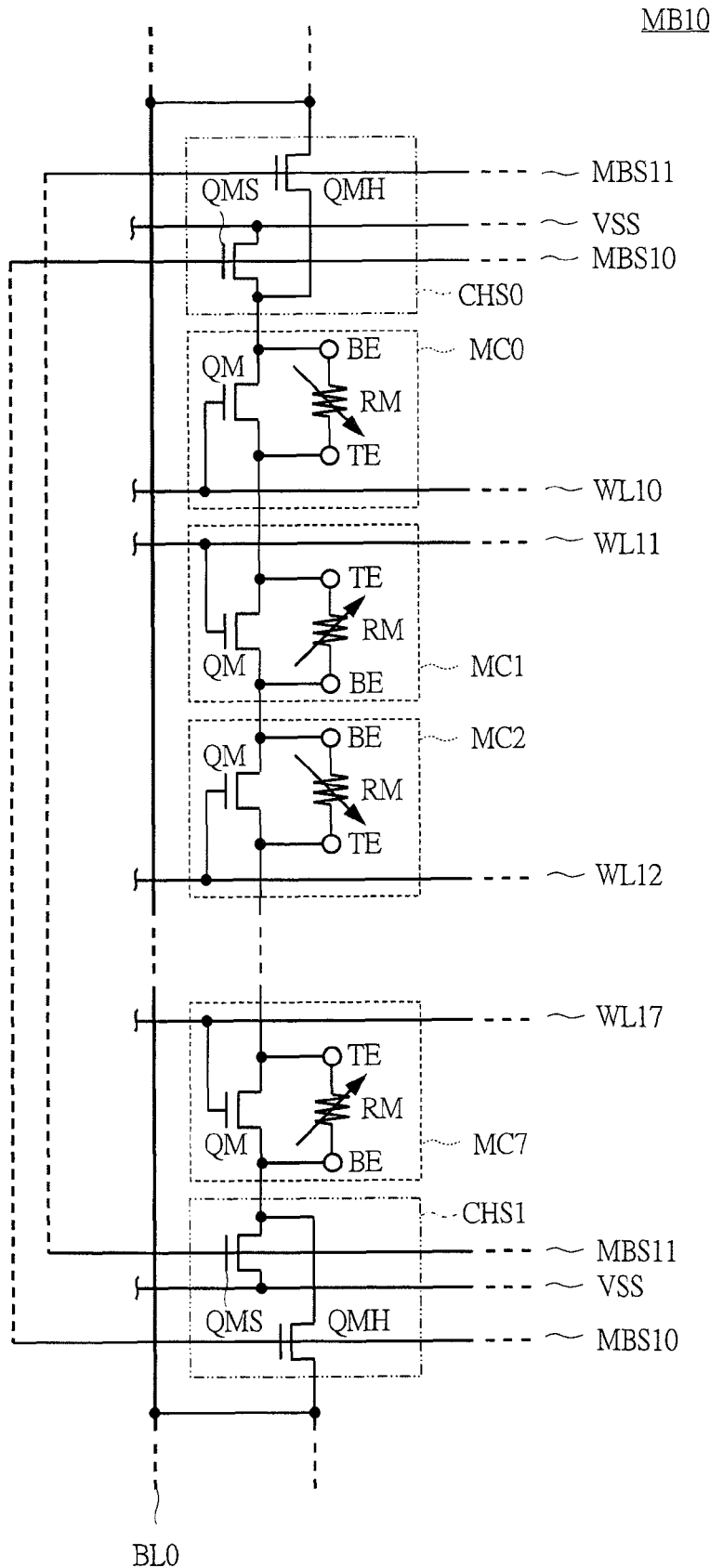
FIG. 23 is another diagram showing the configuration example of the phase change memory array in the semiconductor information storage device according to the fourth embodiment of the present invention.

FIG. 23 shows a configuration of a memory block according to the fourth embodiment. In FIG. 23, a memory block MB10 is shown as one example. A difference from the memory block shown in FIG. 18 is a point of providing two pairs of hierarchy switches CHS0 and CHS1. Each hierarchy switch is configured with two pairs of NMOS transistors QMH and QMS. The transistor QMH is inserted between the bit line BL0 and the memory cell MC0 to the memory cell MC7 to control a connection of the bit line BL0 and the memory cells MC0 to MC7 as well as the hierarchy switch shown in FIG. 18. The transistor QMS is inserted between the memory cells MC0 to MC7 and the ground voltage terminal VSS to control a connection between the memory cells MC0 to MC7 and the ground voltage terminal VSS. A memory block selecting signal MBS10 is connected to each gate electrode of the transistor QMS in the hierarchy switch CHS0 and the transistor QMH in the hierarchy switch CHS1. A memory block selecting signal MBS11 is connected to each gate electrode of the transistor QMS in the hierarchy switch CHS1 and the transistor QMH in the hierarchy switch CHS0.

FIG. 24 shows a layout diagram of the memory block shown in FIG. 23. There are two characteristics of the layout as follows. The first one is that patterns corresponding to a power feeder of the ground voltage VSS are arranged at two portions in the memory block. The second one is that a contact and a via used for a connection between a bit line and a memory cell are shared by memory blocks adjacent to each other.

"AA" indicates a pattern showing an active region to be a current path of an NMOS transistor. "FG" indicates a pattern showing a gate electrode of the NMOS transistor and corresponds to the main block selecting signals MBS10 and MBS11, and the word lines WL10 to WL17 in the circuit diagram shown in FIG. 23. "FM" indicates a pattern showing a first metal layer and is used for the power feeder of the ground voltage VSS. "SM" indicates a pattern showing a second metal layer and is used for a connection of the memory cell. "TM" indicates a pattern showing a third metal layer and is used for the bit line BL0. "FV" indicates a pattern showing a first via for connecting between the first metal layer and the second metal layer. "SV" indicates a pattern showing a second via for connecting between the second metal layer and the third metal layer. "CL" indicates a pattern showing the chalcogenide film and corresponds to the storage device RM. "TC" indicates a pattern showing an upper contact formed on an upper portion of the chalcogenide film. Note that, in FIG. 24, a pattern showing a contact formed on a lower portion of the chalcogenide film is omitted for simplification.

FIG. 24 show, further, a cross sectional structure corresponding to the layout diagram. "2400" indicates a p-type semiconductor substrate or a p-well, "2401" indicates a gate electrode of the NMOS transistor, "2402" indicates an n-type diffusion layer to be a source electrode and a drain electrode of the NMOS transistor, and "2403" indicates a device isolation region. "2410" indicates the first metal layer, "2411" indicates the second metal layer, and "2412" indicates the third metal layer. "2420" indicates the chalcogenide film. "2430" indicates the first via for connecting between the first metal layer and the second metal layer, "2433" indicates the second via for connecting between the second metal layer and the third metal layer, and "2431" indicates the upper contact for connecting between the first metal layer and the chalcogenide film. "2432" indicates the lower contact for connecting between the upper contact or the chalcogenide film and the source voltage or the drain voltage of the NMOS transistor. In adjacent memory cells, the chalcogenide films (that is the storage devices RM) are connected through the first metal layer or a p-type diffusion layer of the NMOS transistor.

In the layout and cross sectional structure described above, the bit line, the ground voltage VSS power feeder, and the memory block are connected by using the first and second metal layers so that the bit lines can be arranged with a minimum pitch, thereby capable of suppressing the area size of the memory array.

Figure 25:
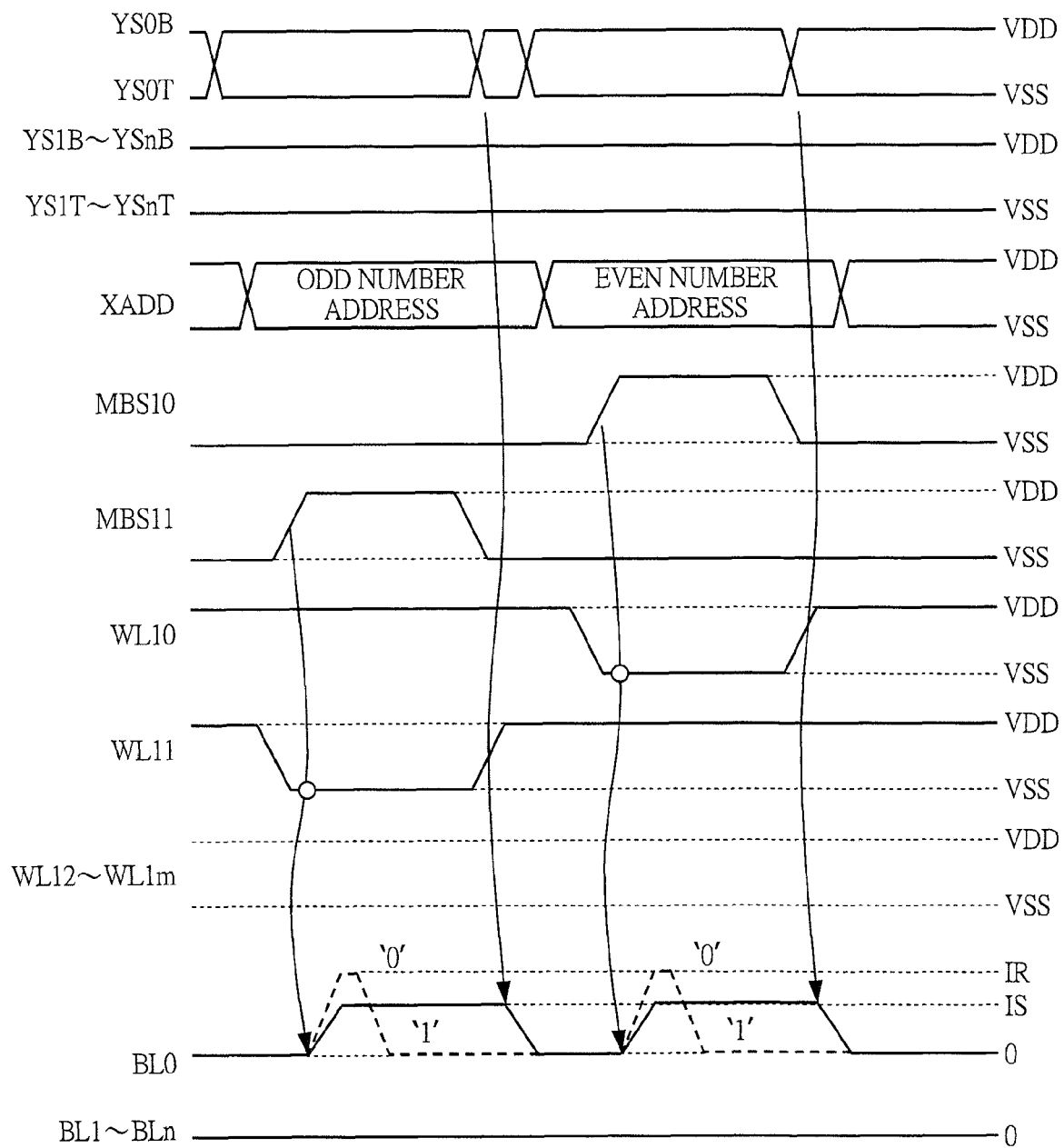
FIG. 25 is a diagram showing one example of a timing diagram in a writing operation of the phase change memory array of FIG. 18.
Figure 26:
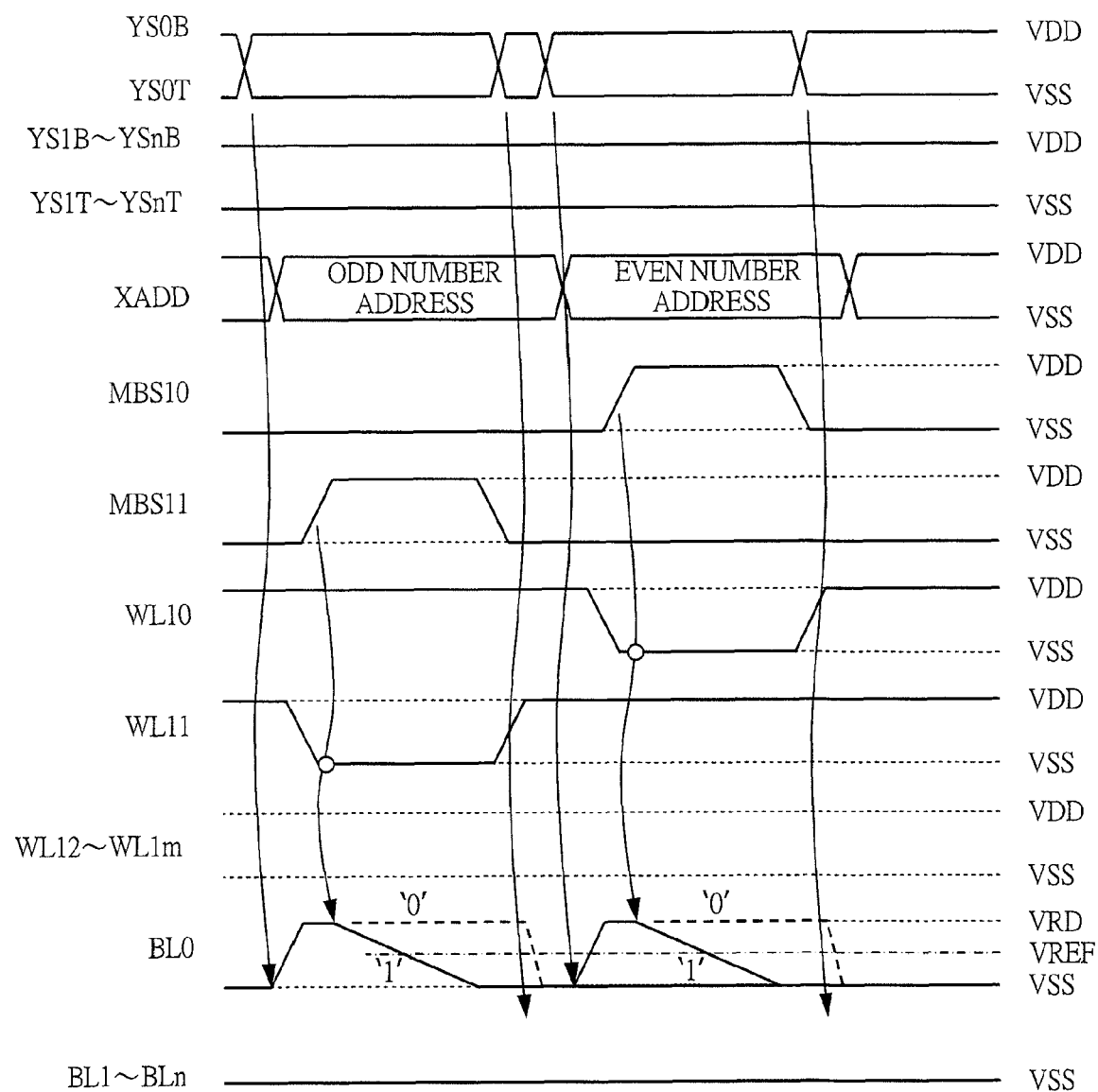
FIG. 26 is a diagram showing one example of a timing diagram in a reading operation of the phase change memory array of FIG. 18.

FIG. 25 shows a writing operation of the memory array shown in FIG. 22. FIG. 25 shows a timing diagram with an assumption that a memory cell in the memory block MBS10 is selected. Differences shown in FIG. 25 from that shown in FIG. 20 are the following two points. The first one is that, when a memory cell corresponding to an odd number row address such as a word line WL11 is selected, the memory block selecting signal MBS11 maintained at the ground voltage VSS is driven to the power source voltage VDD so that the bit line BL0 and the memory cells MC0 to MC7 are connected to form a current path. The second one is that, when a memory cell corresponding to an even number row address such as a word line WL10 is selected, the memory block selecting signal MBS10 maintained at the ground voltage VSS is driven to the power source voltage VDD so that the bit line BL0 and the memory cells MC0 to MC7 are connected to form a current path. FIG. 26 shows a reading operation of the memory array shown in FIG. 22. Also in this operation, a selecting operation similar to the rewriting operation shown in FIG. 25 is performed.

By the above-mentioned configuration and operation, it is made possible to apply current to the storage device RM in each memory cell in the direction from the upper electrode TE to the lower electrode BE in spite of maintaining the same direction of the rewriting current flowing in the bit line BL0. Thereby, phase-changing regions can be provided on the lower electrode BE (that is the lower contact) side in all the storage devices RM, so that variations of resistance values can be suppressed. Also, the configuration and operation of the rewriting circuit PRGM1 shown in FIG. 22 are simplified so that the area size of the circuit block can be suppressed.

Finally, an effect according to the fourth embodiment is described below. In the fourth embodiment, the connection of the bit line and the source line to the memory block is controlled by using two pairs of hierarchy switches CHS0 and CHS1 as shown in FIG. 23 so that it is made possible to apply the rewriting current to the storage device RM in each memory cell in the direction from the upper electrode TE toward the lower electrode BE. Also, since the current can be driven only in one direction in the rewriting circuit PRGM1, a circuit configuration thereof is simplified so that the area size of the circuit block can be suppressed.

Fifth Embodiment

Figure 27:
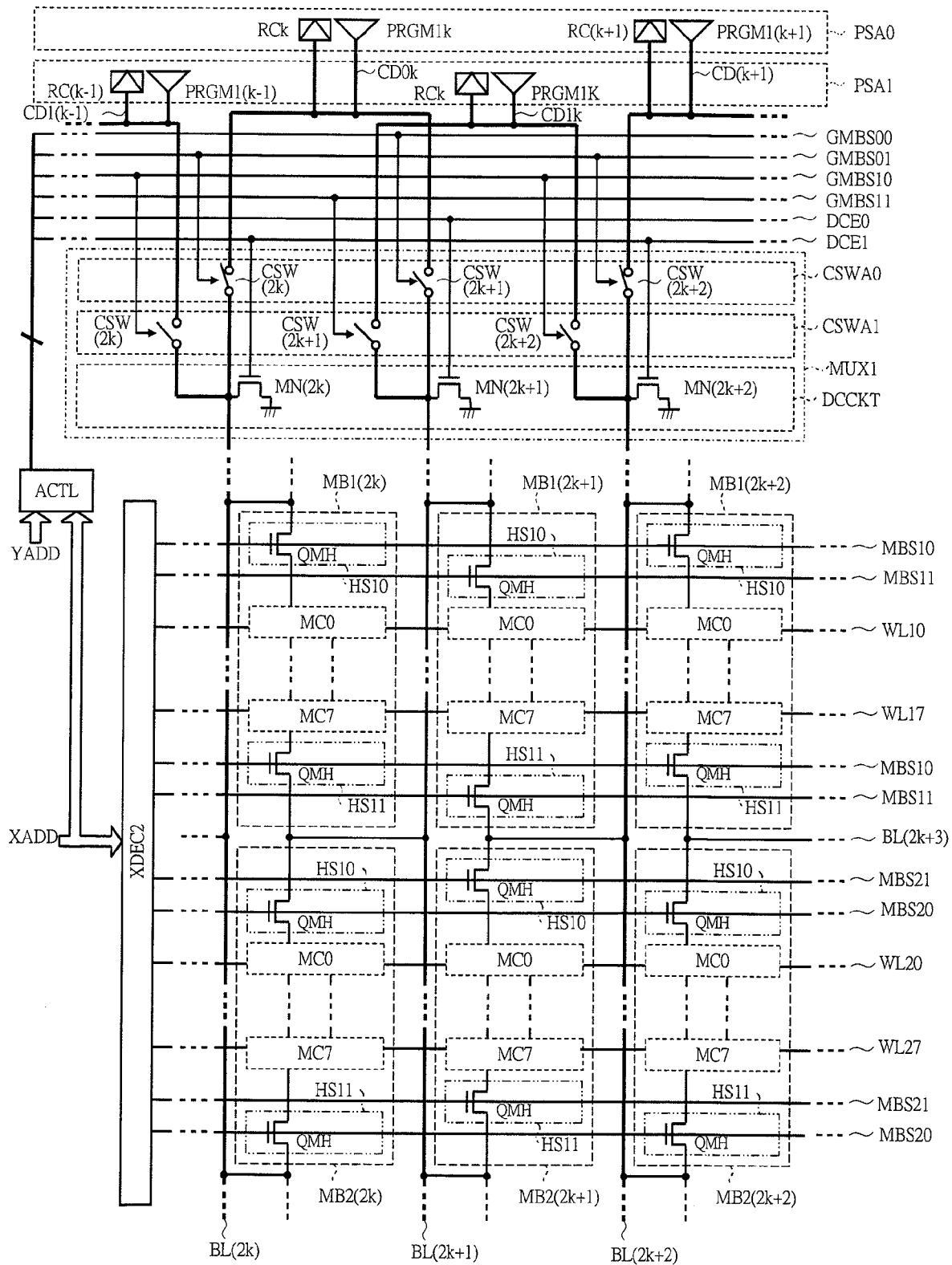
FIG. 27 is a diagram showing a configuration example of a phase change memory array in a semiconductor information storage device according to a fifth embodiment of the present invention.

In a fifth embodiment, still another configuration and operation of a memory array will be explained. FIG. 27 shows a configuration of the memory array and a memory block according to the fifth embodiment. The memory array according to the fifth embodiment is characterized by forming a current path of a memory cell by using two bit lines in order to block inflow of feeble current into an unselected memory cell in a memory block connected to a selected word line. Also, characteristics of a circuit configuration of the fifth embodiment are the following four points.

A first characteristic is to provide a configuration in which a memory block is connected to two bit lines adjacent to each other. That is, when explanation is made with taking a memory block MB1(2k) as an example with reference to FIG. 28, each of memory cells MC0 to MC7 and each of bit lines BL(2k) and BL(2k+1) are connected via hierarchy switches HS10 and HS11 arranged at both ends of the memory block. Each of the hierarchy switches HS10 and HS11 is configured with an NMOS transistor QMH and is controlled by a memory block selecting signal MBS10 to be an output signal from a row decoder XDEC2.

A second characteristic is to connect a memory block intersected with each word line to a bit line pair in every one block. When a memory block MB1(2k) and a memory block MB1(2k+1) are focused, a memory block corresponding to an even number column address such as the memory block MB1(2k) is connected to a bit line pair (BL(2k), BL(2k+1)) by using a memory block selecting signal MBS10. On the other hand, a memory block corresponding to an odd number column address such as the memory block MB1(2k+1) is connected to a bit line pair (BL(2k+1), BL(2k+2)) by using a memory block selecting signal MBS11.

A third characteristic is to arrange a reading circuit and a rewriting circuit in each adjacent bit lien pair. In FIG. 27, regarding a bit line pair (BL(2k), BL(2k+1)), a reading circuit RCk and a rewriting circuit PRGM1k are arranged via a multiplexer MUX1 and a common data line CD0k described later. Also, regarding bit line pair (BL(2k+2), BL(2k+3)), a reading circuit RC(k+1) and a rewriting circuit PRGM1(k+1) are arranged via the multiplexer MUX1 and a common data line CD0(k+1). These reading circuit group and rewriting circuit group are clearly shown as a reading and writing circuit array PSA0. On the other hand, regarding a bit line pair (BL(2k−1), BL(2k)), a reading circuit RC(k−1) and a rewriting circuit PRGM1(k−1) are arranged via the multiplexer MUX1 and a common data line CD1(k−1). Also, regarding a bit line pair (BL(2k+1), BL(2k+2)), the reading circuit RCk and the rewriting circuit PRGM1k are arranged via the multiplexer MUX1 and the common data line CD1k. These reading circuit group and writing circuit group are clearly shown as a reading and writing circuit array PSA1.

A fourth characteristic is that the multiplexer MUX1 is configured with two column selecting switch arrays CSWA0 and CSWA1 and a discharge circuit DCCKT, and is controlled by using a signal outputted from an array control circuit ACTL according to a column address and a row address. Each of the column selecting switch arrays CSWA0 and CSWA1 has the same configuration as the column selecting switch array CSWA shown in FIG. 17. However, a CMOS transmission gate is represented by a switch symbol for simplification. One column selecting switch array CSWA0 is a circuit block for connecting between the bit line and the reading and writing circuit array PSA0. A column switch arranged in a bit line corresponding to an even number column address such as CSW(2k) and CSW(2k+2) is controlled by a global memory block selecting signal GMBS01. A column switch arranged in a bit line corresponding to an odd number column address such as CSW(2k+1) is controlled by a global memory block selecting signal GMBS00. Another column selecting switch array CSWA1 is a circuit block for connecting between the bit line and the reading and writing circuit array PSA1. A column switch arranged in a bit line corresponding to an even number column address such as CSW(2k) and CSW(2k+2) is controlled by a global memory block selecting signal GMBS10. A column switch arranged in a bit line corresponding to an odd number column address such as CSW(2k+1) is controlled by a global memory block selecting signal GMBS11. Also, in the discharge circuit DCCKT, an NMOS transistor arranged in a bit line corresponding to an even number column address such as MN(2k) and MN(2k+2) is controlled by a discharge starting signal DCE0. An NMOS transistor arranged in a bit line corresponding to an odd number column address such as MN(2k+1) is controlled by a discharge starting signal DCE1.

Figure 28:
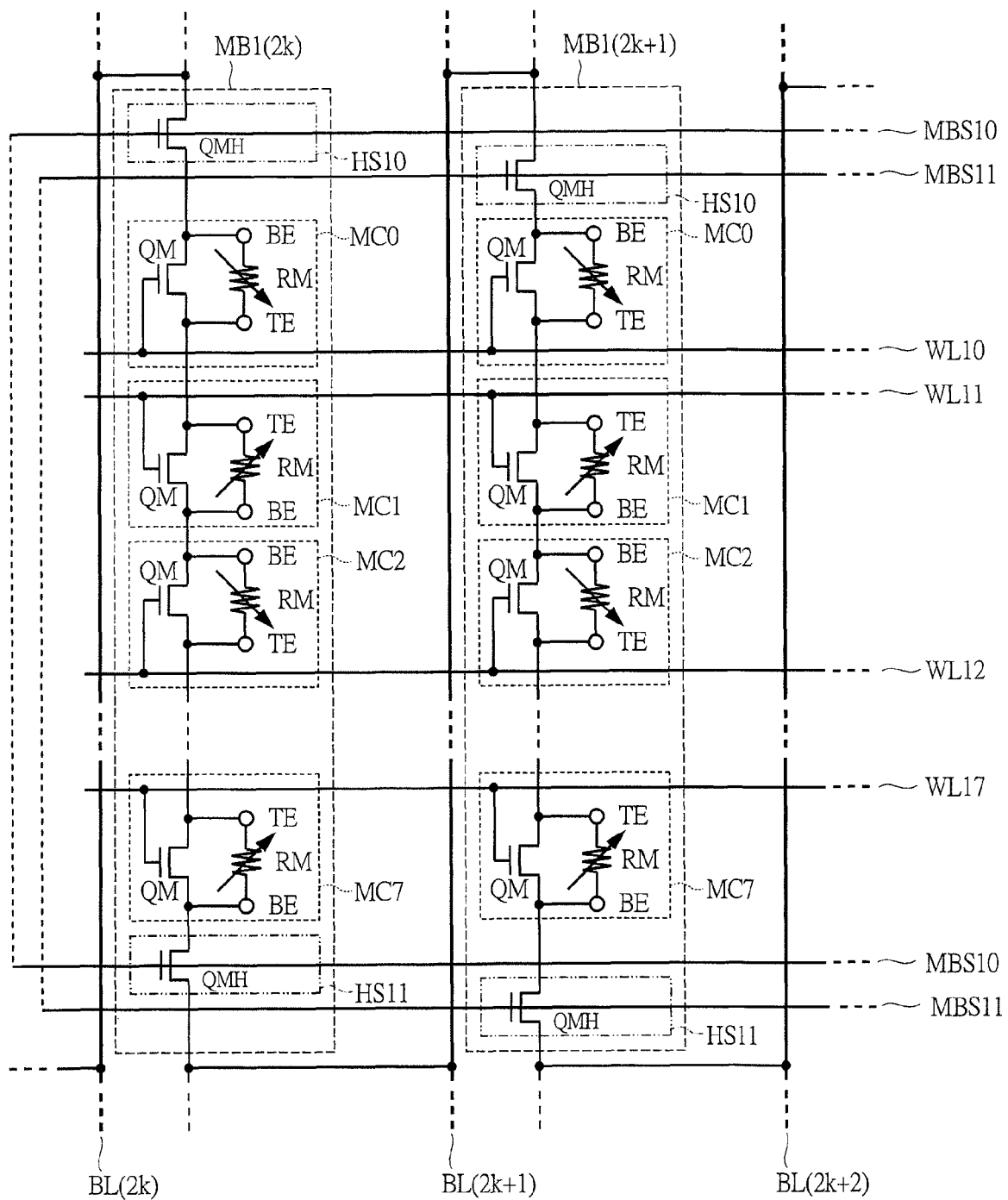
FIG. 28 is another diagram showing the configuration example of the phase change memory array in the semiconductor information storage device according to the fifth embodiment of the present invention.
Figure 29A:
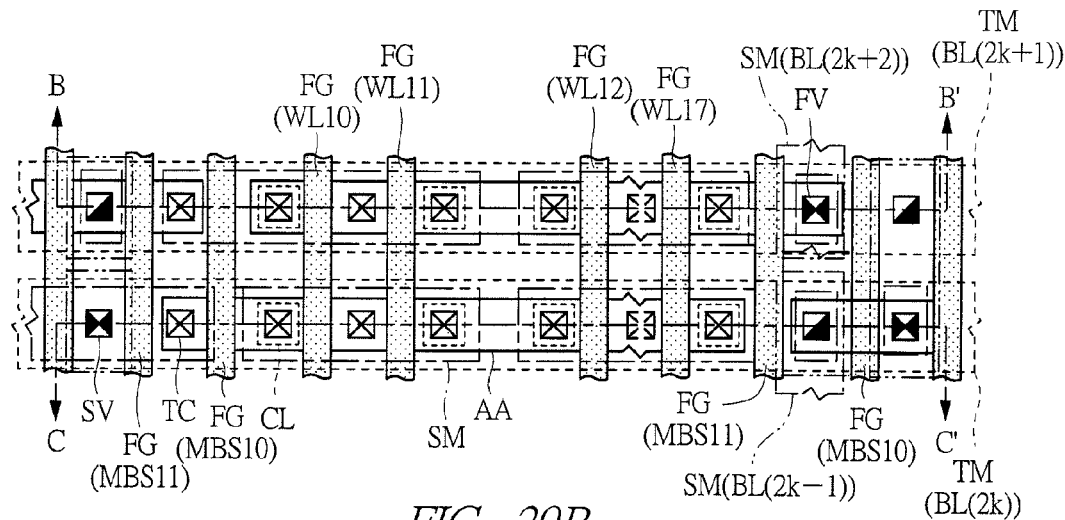
FIGS. 29A to 29C are another diagrams each showing the configuration example of the phase change memory array in the semiconductor information storage device according to the fifth embodiment of the present invention.
Figure 29B:
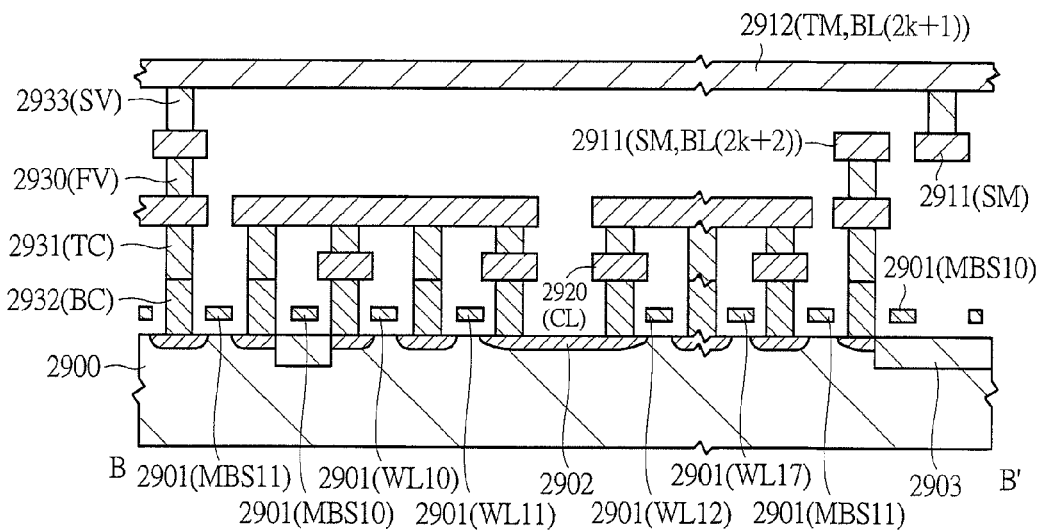
Figure 29C:
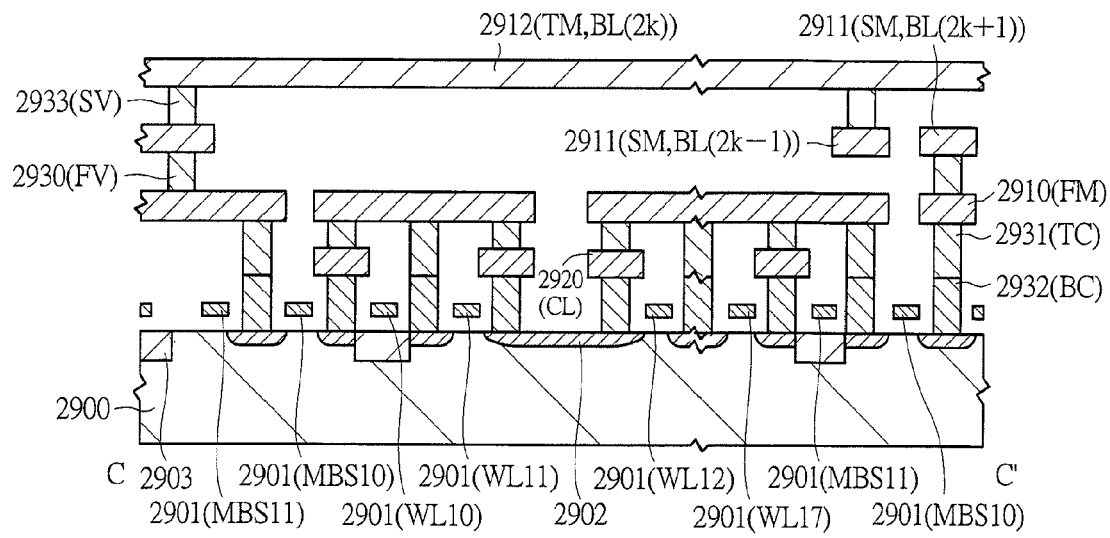

FIG. 29 shows a layout diagram of the memory block shown in FIG. 28. The layout is characterized by a connection of memory cells by using the first metal layer, and at the same time, a connection between the memory block and the bit line by using the second metal layer.

"AA" indicates a pattern showing an active region to be a current path of an NMOS transistor. "FG" indicates a pattern showing a gate electrode of the NMOS transistor and corresponds to a memory block selecting signal MBS10 and MBS11 and word lines WL10 to WL17. "FM" indicates a pattern showing a first metal layer and "SM" indicates a pattern showing a second metal layer. "TM" indicates a pattern showing a third metal layer which is used for the bit lines BL(2k) and BL(2k+1). "FV" indicates a pattern showing a first via for connecting between the first metal layer and the second metal layer. "SV" indicates a pattern showing a second via for connecting the second metal layer and the third metal layer. "CL" indicates a pattern showing a chalcogenide film and corresponds to the storage device RM. "TC" indicates a pattern showing an upper contact formed on an upper portion of the chalcogenide film. Note that, in FIG. 29, a pattern showing a contact formed on a lower portion of the chalcogenide film is omitted for simplification.

FIG. 29 shows, further, a sectional view corresponding to the layout diagram. "2900" indicates a p-type semiconductor substrate or a p-well, "2901" indicates a gate electrode of the NMOS transistor, "2902" indicates an n-type diffusion layer to be source and drain electrodes of the NMOS transistor, and "2903" indicates a device isolation region. "2910" indicates the first metal layer, "2911" indicates the second metal layer, and "2912" indicates the third metal layer. "2920" indicates the chalcogenide film. "2930" indicates the first via for connecting between the first metal layer and the second metal layer, "2933" indicates the second via for connecting between the second metal layer and the third metal layer, and "2931" indicates the upper contact for connecting between the first metal layer and the chalcogenide film. "2932" indicates the lower contact for connecting between the upper contact or the chalcogenide film and the source or drain voltages of the NMOS transistor. The chalcogenide films (that is, the storage devices RM) in memory cells adjacent to each other are connected via the first metal layer or the p-type diffusion layer of the NMOS transistor.

In the above-described layout and the cross sectional structure, since the bit line and the memory block are connected by using the second metal layer, it is made possible to form the bit line and the source line in the same direction viewed from the memory cell by using the bit line pairs each arranged at a minimum pitch interval as arranging the bit lines each at a minimum pitch interval. Thereby, it is possible to block inflow of feeble current to the unselected memory cell in the memory block connected to the selected word line so that device characteristic degradation and storage information crash of the unselected memory cell can be avoided.

Figure 30:
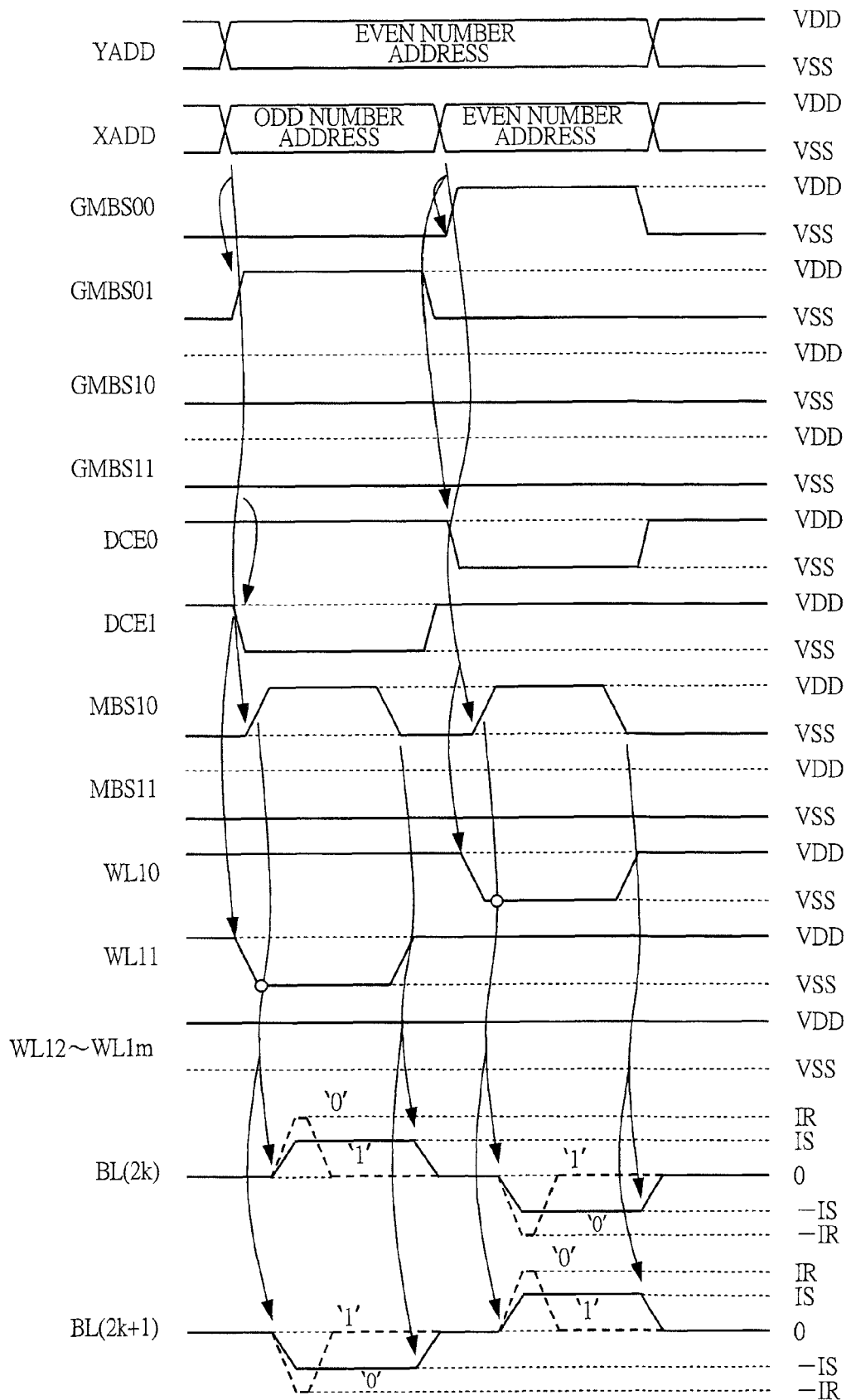
FIG. 30 is a diagram showing one example of a timing diagram in a writing operation of the phase change memory array of FIG. 27.

FIG. 30 shows a writing operation of the memory array shown in FIG. 27. FIG. 30 shows a timing diagram by an assumption that a memory cell in a memory block MBS1(2k) is selected. First, an operation of writing storage information in the memory cell MC1 on the word line WL11 will be explained. In this case, differences from the operation shown in FIG. 20 are the following two points. Firstly, the one point is that, the discharge start signal DCE1 maintained at the power source voltage VDD is driven to the ground voltage VSS to cut off a transistor MN(2k) in the discharge circuit DCCKT, and at the same time, the global memory block selecting signal GMBS01 maintained at the ground voltage VSS is driven to the power source voltage VDD, so that the column switch is activated, thereby connecting between the bit line BL(2k) and the rewriting circuit PRGM0k in the reading and writing circuit array PSA0. Secondly, the another point is that, the memory block selecting signal MBS10 maintained at the ground voltage VSS is driven to the power source voltage VDD, so that the hierarchy switch is activated, thereby connecting between the bit line pairs (BL(2k), BL(2k+1)) and the memory cells MC0 to MC7. By such a selecting operation, there is provided a current path flowing from the rewriting circuit PRGM0k in the reading and writing circuit array PSA0 to the terminal of the ground voltage VSS via the bit line BL(2k), the memory block MB1(2k), the bit line BL1(2k+1), and the transistor MN(2k+1) in the discharge circuit DCCKT. Thereby, the rewriting current can be applied to the storage device RM in the memory cell corresponding to the odd number row address such as MC1 in the direction from the upper electrode TE to the lower electrode BE.

Next, a writing operation of storage information in the memory cell MC0 on the word line WL10 will be explained. Also in this case, similarly to the previous description, the discharge start signal DCE0 maintained at the power source voltage VDD is driven to the ground voltage VSS, so that the transistor MN(2k+1) in the discharge circuit DCCKT is cut off, and at the same time, the global memory block select signal GMBS00 maintained at the ground voltage VSS is driven to the power source voltage VDD, so that the column switch is activated, thereby connecting between the bit line (BL(2k+1)) and the rewriting circuit PRGM0k in the reading and writing circuit array PSA0. Sequentially, the memory block selecting signal MBS10 maintained at the ground voltage VSS is driven to the power source voltage VDD, so that the hierarchy switch is activated, thereby connecting between the bit line pair (BL(2k), BL(2k+1)) and the memory cells MC0 to MC7. By such a selecting operation, there is provided a current path flowing from the rewriting circuit PRGM0k in the reading and writing circuit array PSA0 to the terminal of the ground voltage VSS via the bit line BL(2k+1), the memory block MB1(2k), the bit line BL1(2k), and the transistor MN(2k) in the discharge circuit DCCKT is formed. Thereby, the rewriting current can be applied to the storage device RM in the memory cell corresponding to the even number row address such as MC0 in the direction from the upper electrode TE to the lower electrode BE.

Figure 31:
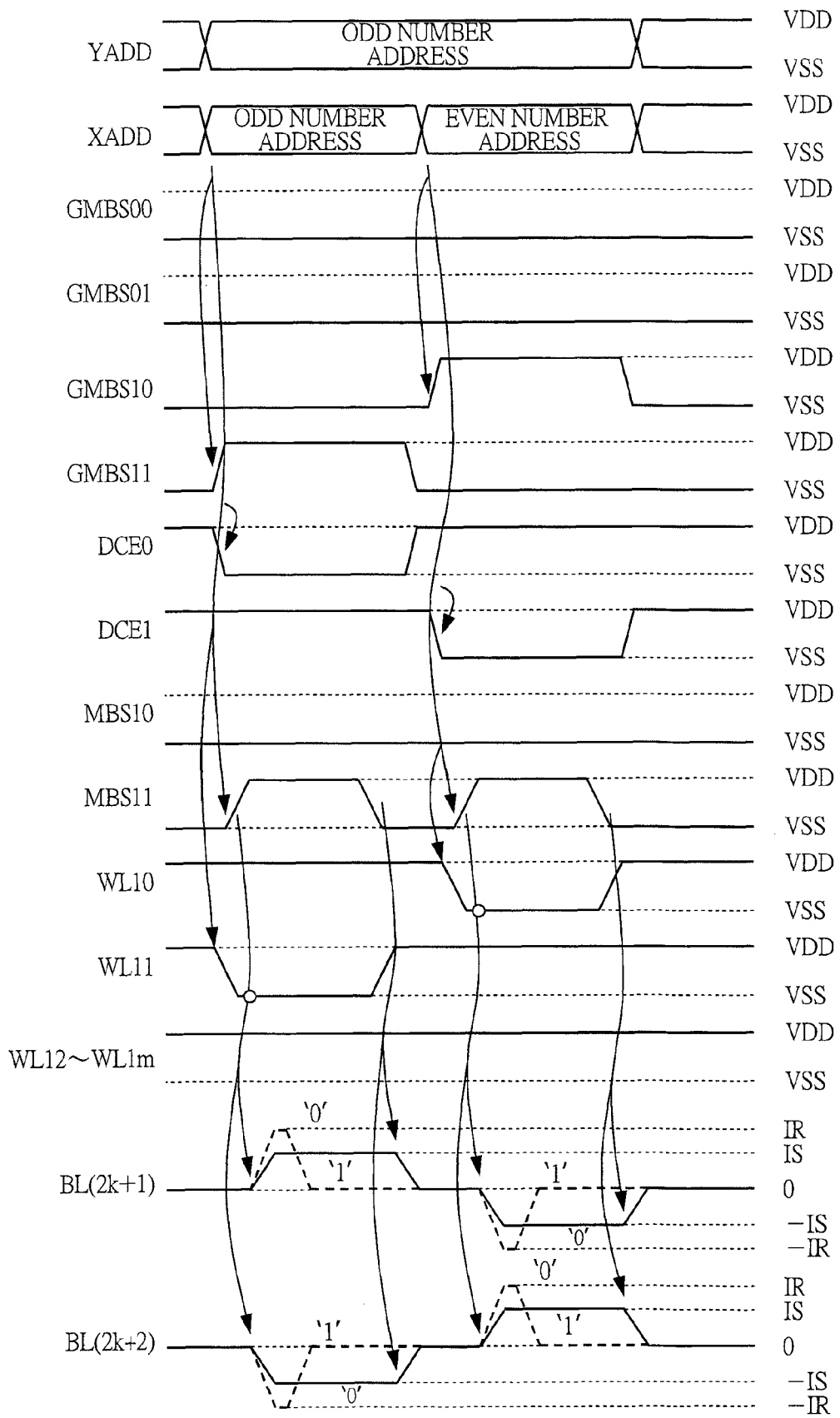
FIG. 31 is another diagram showing one example of the timing diagram in the writing operation of the phase change memory array of FIG. 27.

Also, when the memory cell in the memory block corresponding to the odd number column address such as MBS1 (2k+1) is selected, the rewriting circuit PRGM0k in the reading and writing circuit array PSA1, the bit line pairs (BL(2k+1), BL(2k+2)), and the memory block are connected by using the global memory block selecting signals GMBS10 and GMBS11, and the memory block selecting signal MBS11. The operation is shown in FIG. 31.

Figure 32:
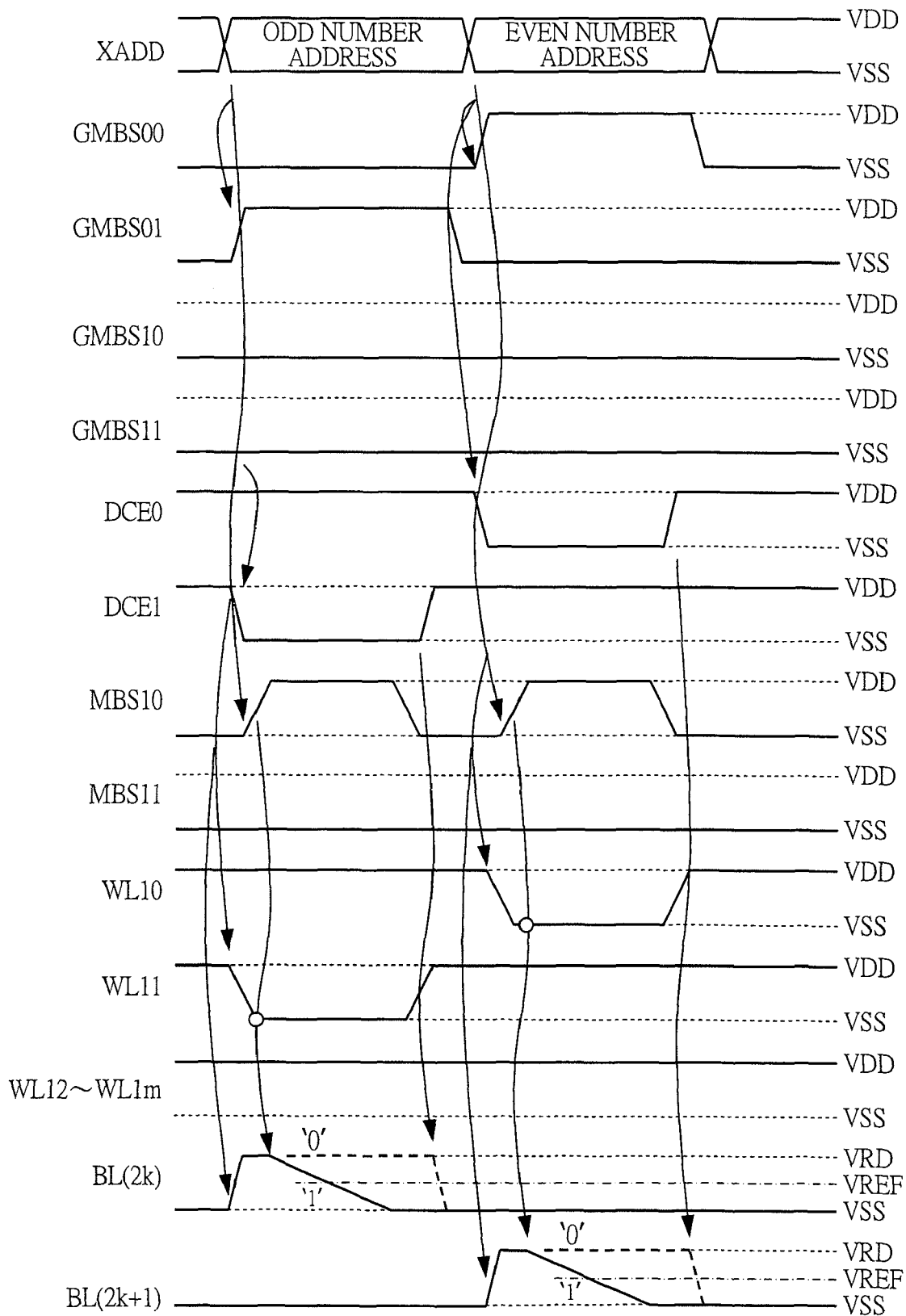
FIG. 32 is still another diagram showing one example of the timing diagram in the writing operation of the phase change memory array of FIG. 27.

FIG. 32 shows a reading operation of the memory array shown in FIG. 27. FIG. 32 shows a timing diagram when the reading is performed in an order of the memory cells MC1 and MC0 as one example with an assumption that the memory cells in the memory block MBS1(2k) are selected. In these operations, the selecting operation of the memory cell is performed in a manner similar to the rewriting operation shown in FIG. 30.

Finally, effects obtained by the above-described configuration and operation will be described. In the fifth embodiment as shown in FIG. 27, the bit line pair and the memory block are connected by using two pairs of hierarchy switches HS0 and HS1, so that the rewriting current can be applied to the storage device RM in each memory cell in the direction from the upper electrode TE to the lower electrode BE similarly to the third embodiment and the fourth embodiment. Therefore, a phase change region can be formed on the same position on the storage device, so that variation of resistance values can be suppressed. Also, since the bit line and the source line which are viewed from the memory cell are formed by the bit line pair, inflow of current into the unselected cell on the selected word line can be avoided. Therefore, degradation of the device characteristics of the unselected cell and storage information crash can be avoided. By these effects, a phase change memory with high integration and with high reliability can be realized.

In the foregoing, the invention made by the inventors of the present invention has been concretely described based on the drawings. However, it is needless to say that the present invention is not limited to the foregoing embodiments and various modifications and alterations can be made within the scope of the present invention.

INDUSTRIAL APPLICABILITY

According to significant spread of mobile equipment, demand of a nonvolatile memory has been increased. Particularly, there is demanded a memory in which embodiment with a logic circuit is easy, high-speed writing is possible, the number of rewritable times is large, and drive voltage is low. A phase change memory is a device expected as a memory having all these features.

The present invention for realizing stable writing of a phase change memory largely contributes to practical use of a phase change memory. Particularly, in a mixedly mounted microprocessor with a nonvolatile memory and an IC card, a possibility of widely use of the present invention is significantly high.

The invention claimed is:

1. A semiconductor storage device comprising:
a phase change thin film having two stable phases of a crystal state having a first resistance value and an amorphous state having a resistance value higher than the first resistance value;
first and second electrodes provided on one side of the phase change thin film;
a third electrode provided on the other side of the phase change thin film;
a first transistor whose drain terminal is connected to the first electrode, whose source terminal is connected to the third electrode, and whose gate terminal is connected to a first word line; and
a second transistor whose drain terminal is connected to the second electrode, whose source terminal is connected to the third electrode, and whose gate terminal is connected to a second word line, wherein
a first memory cell is configured with the first transistor and a first phase change region in the phase change thin film sandwiched between the first electrode and the third electrode,
a second memory cell is configured with the second transistor and a second phase change region in the phase change thin film sandwiched between the second electrode and the third electrode,
at a writing time to the first memory cell, the first transistor is turned off to carry a current from the first electrode to the third electrode, and
at a writing time to the second memory cell, the second transistor is turned off to carry a current from the second electrode to the third electrode.

2. The semiconductor storage device according to claim 1, further comprising a current controlling transistor connected to the first memory cell and the second memory cell in series.

3. The semiconductor storage device according to claim 2, wherein
a plurality of the first and second memory cells are repetitively connected in series, and
if it is assumed that the number of memory cells connected in series in a memory cell array is N,
an ON resistance $R_{ON}$ and an OFF resistance $R_{OFF}$ of a transistor configuring the memory cell, a resistance value $R_{reset}$ when the phase change thin film configuring the memory cell is in an amorphous state, and a resistance value $R_{set}$ when the phase change thin film is in a crystal state satisfy a condition of $$(N-1) \times (R_{ON}^2/R_{OFF}) \times ((R_{OFF}+R_{set})/(R_{ON}+R_{set})) < 10 \times R_{reset}.$$

4. The semiconductor storage device according to claim 1, wherein
at a reading time, only the transistor of one selected from the memory cells is turned off, and the transistor of the unselected memory cell is turned on, so that a reading voltage is applied to both the electrodes of one selected from the phase change regions to read data of the selected memory cell, and
at a writing time, only the transistor of one selected from the memory cells is turned off, and the transistor of the unselected memory cell is turned on, so that a writing voltage is applied to both the electrodes of one selected from the phase change regions to apply a writing current to the selected phase change region.

5. The semiconductor storage device according to claim 1, wherein
when the writing to one selected from the memory cells is performed, the writings to the adjacent memory cells in the memory cells connected in series are performed by applying currents with mutually reverse polarities.

6. The semiconductor storage device according to claim 1, wherein
such an arrangement is formed that a plurality of memory cell arrays in which the same number of memory cells are connected in series are disposed, and that word lines in a direction perpendicular to the memory cell arrays, and the memory cells to be written and read are selected according to a combination of the memory cell arrays and the word lines.

7. The semiconductor storage device according to claim 6, wherein
when information is written in the first memory cell, the first transistor is turned to an off state via the first word line connected to a gate electrode of the first transistor configuring the selected first memory cell, and a first current pulse is applied to the memory cell array including the selected first memory cell and connected in series so that the writing is performed, and
when a writing is performed to the second memory cell adjacent to the first memory cell via the second word line adjacent to the first word line, a second current pulse having a reverse direction to that of the first current pulse is applied to the cell array including the first and second memory cells.

8. The semiconductor storage device according to claim 1, wherein
when a reading of one selected from the memory cells is performed,
a pulse always having a same condition to all the memory cells to be read is used for a reading voltage applied to both ends of one of the memory cells connected in series.

9. A semiconductor storage device comprising:
a plurality of word lines;
a plurality of bit lines intersecting with the plurality of word lines;
a plurality of memory cells arranged at the intersections of the plurality of word lines and the plurality of bit lines and each including a transistor and a storage device whose resistance changes according to storage information;

a plurality of hierarchy switches each arranged between the plurality of word lines at a constant interval;

a common data line;

a switch circuit arranged between the plurality of bit lines and the common data line and for selecting one of the plurality of bit lines to connect the one to the common data line; and a rewriting circuit connected to the common data line, wherein a first hierarchy switch of the plurality of hierarchy switches is inserted between a first bit line of the plurality of bit lines and a first memory cell of the plurality of memory cells and between a ground voltage terminal and the first memory cell, and a second hierarchy switch of the plurality of the hierarchy switches is inserted between the first bit line and a second memory cell of the plurality of memory cells and between the ground voltage terminal and the second memory cell.

10. The semiconductor storage device according to claim 9, wherein when the first bit line and the first memory cell are connected to each other by the first hierarchy switch, and when the ground voltage terminal and the second memory cell are connected to each other by the second hierarchy switch, a current flows in the first and second memory cells in a first direction, and when the ground voltage terminal and the first memory cell are connected to each other by the first hierarchy switch, and when the first bit line and the second memory cell are connected to each other by the second hierarchy switch, a current flows in the first and second memory cells in a second direction, and directions of the first current and the second current are reverse to each other.

11. The semiconductor storage device according to claim 10, wherein the storage device and the transistor are connected in parallel in each of the plurality of memory cells.

12. The semiconductor storage device according to claim 11, wherein the storage device is a material containing a chalcogenide material.

13. A semiconductor storage device comprising:

a first phase change thin film having two stable phases of a crystal state having a first resistance value and an amorphous state having a resistance value higher than the first resistance value;

a first electrode provided on one side of the first phase change thin film;

a second electrode provided on the other side of the first phase change thin film;

a first transistor whose drain terminal is connected to the first electrode, whose source terminal is connected to the second electrode, and whose gate terminal is connected to a first word line;

a second phase change thin film having two stable phases of the crystal state having the first resistance value and the amorphous state having the resistance value higher than the first resistance value;

a third electrode connected to the second electrode and provided on one side of the second phase change thin film;

a fourth electrode provided on the other side of the second phase change thin film; and a second transistor whose drain terminal is connected to the third electrode, whose source terminal is connected to the fourth electrode, and whose gate terminal is connected to a second word line, wherein a first memory cell is configured with the first transistor and a first phase change region in the phase change thin film sandwiched between the first electrode and the second electrode, a second memory cell is configured with the second transistor and a second phase change region in the phase change thin film sandwiched between the third electrode and the fourth electrode, at a writing operation of information to the first memory cell, the first transistor is turned off and the second transistor is turned on to carry a current from the first electrode to the fourth electrode, and at a writing operation of information to the second memory cell, the first transistor is turned on and the second transistor is turned off to carry a current from the first electrode to the fourth electrode.

* * * * *